US009397696B2

(12) United States Patent
Kataoka

(10) Patent No.: US 9,397,696 B2
(45) Date of Patent: Jul. 19, 2016

(54) COMPRESSION METHOD, COMPRESSION DEVICE, AND COMPUTER-READABLE RECORDING MEDIUM

(71) Applicant: FUJITSU LIMITED, Kawasaki-shi, Kanagawa (JP)

(72) Inventor: Masahiro Kataoka, Kamakura (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/799,773

(22) Filed: Jul. 15, 2015

(65) Prior Publication Data

US 2016/0028415 A1    Jan. 28, 2016

(30) Foreign Application Priority Data

Jul. 22, 2014 (JP) .................................. 2014-149271

(51) Int. Cl.
*H03M 7/40* (2006.01)
*H03K 5/04* (2006.01)
*H03K 5/00* (2006.01)
*H03M 7/30* (2006.01)

(52) U.S. Cl.
CPC ......... *H03M 7/4031* (2013.01); *H03K 5/00006* (2013.01); *H03K 5/04* (2013.01); *H03M 7/30* (2013.01); *H03M 7/3084* (2013.01)

(58) Field of Classification Search
CPC ... H03K 5/04; H03K 5/00006; H03M 7/3084; H03M 7/30
USPC .............................................. 341/65, 66, 107
See application file for complete search history.

(56) References Cited

U.S. PATENT DOCUMENTS

| 5,532,694 | A  | * | 7/1996  | Mayers ................... G06T 9/005 |
|           |    |   |         | 341/67 |
| 6,906,644 | B2 | * | 6/2005  | Satoh ...................... H03M 7/40 |
|           |    |   |         | 341/51 |
| 7,215,259 | B2 | * | 5/2007  | Kerber ................ H03M 7/3084 |
|           |    |   |         | 341/106 |
| 7,827,237 | B2 | * | 11/2010 | Plamondon ............. H03M 7/30 |
|           |    |   |         | 341/87 |

FOREIGN PATENT DOCUMENTS

| GB | 2 378 868 A | 2/2003 |
| JP | 5-241777 | 9/1993 |
| JP | 2001-136075 | 5/2001 |
| JP | 2003-46392 | 2/2003 |
| WO | WO 2008/146756 A1 | 12/2008 |

* cited by examiner

*Primary Examiner* — Brian Young
(74) *Attorney, Agent, or Firm* — Oblon, McClelland, Maier & Neustadt, L.L.P.

(57) ABSTRACT

A non-transitory computer-readable recording medium stores a compression program that causes a computer to execute a process. The process includes: detecting a matched data that matches a processing target data with a longest length among pieces of data, the pieces of data being extracted from a data sequence that is a compression target; acquiring an appearance frequency of a code corresponding to character data contained in the matched data when a data length of the matched data is smaller than a predetermined length; acquiring an appearance frequency of a code corresponding to the matched data when the data length of the match data is equal to or larger than the predetermined length; and compressing the data sequence using a compression code generated based on the acquired appearance frequency of the code.

5 Claims, 22 Drawing Sheets

FIG.2
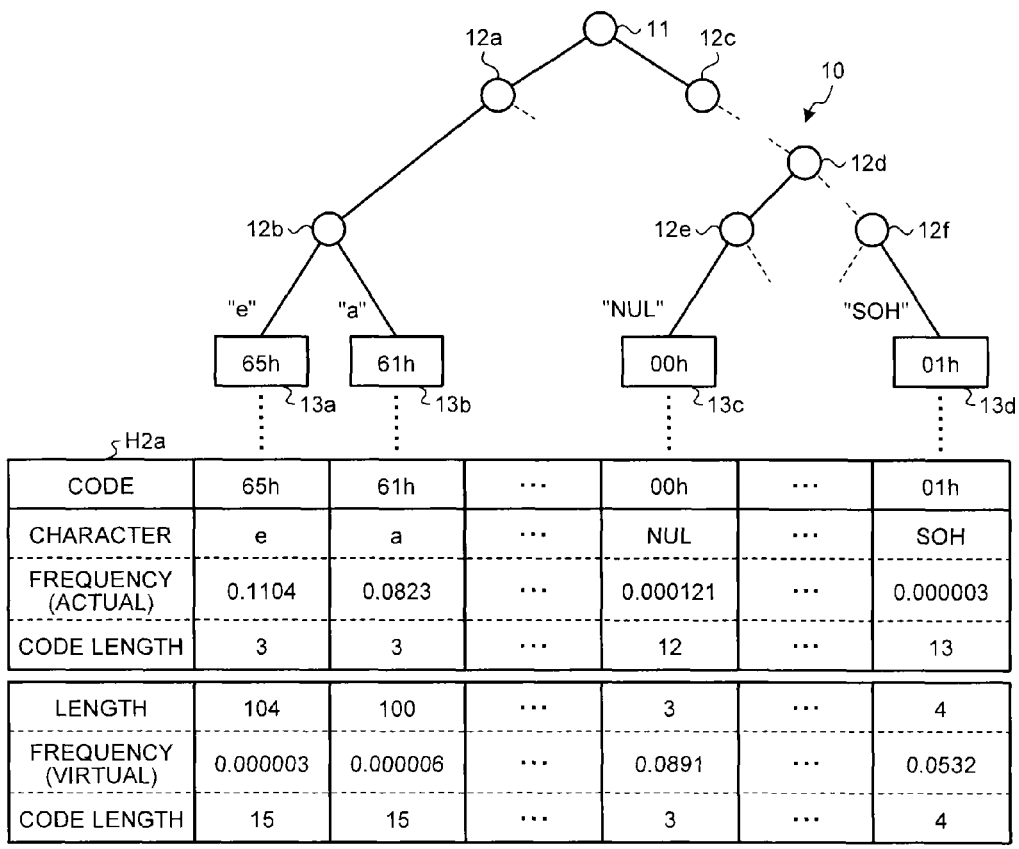
NODE DATA STRUCTURE
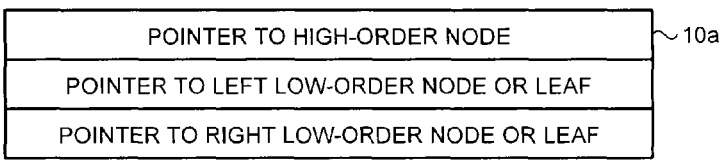
LEAF DATA STRUCTURE
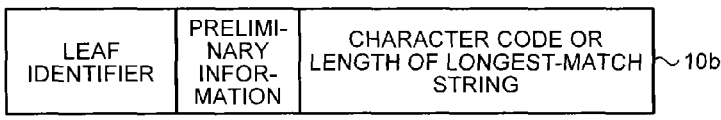

FIG.11
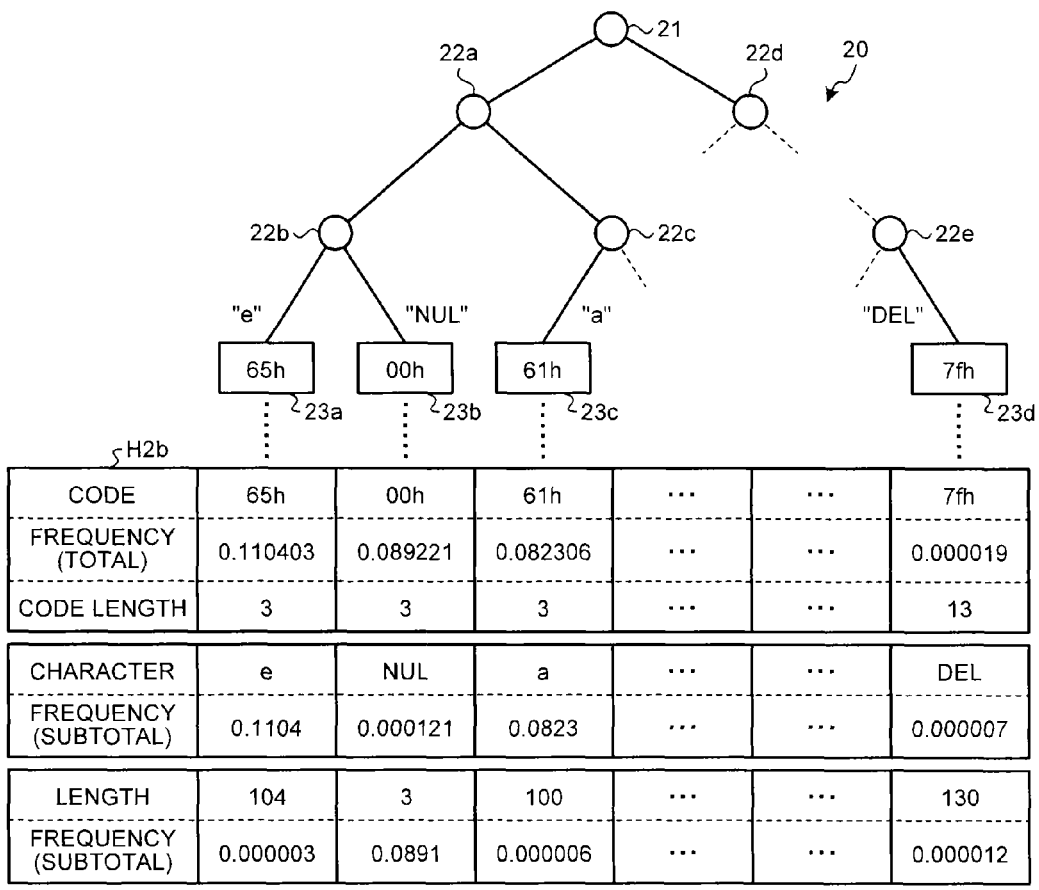
NODE DATA STRUCTURE
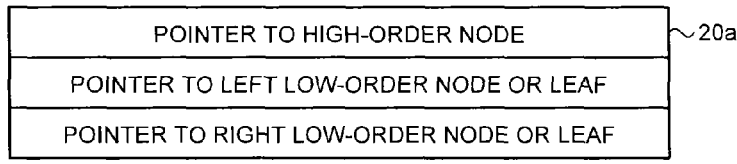
LEAF DATA STRUCTURE
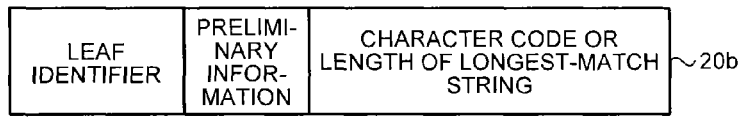

FIG.16

| CHARACTER | NUL | SOH | STX | ... | a | ... | e | ... |
|---|---|---|---|---|---|---|---|---|
| FREQUENCY (SUBTOTAL) | 0.000121 | 0.000003 | 0.00001 | ... | 0.0823 | ... | 0.1104 | ... |

H20b

+

| LENGTH | 3 | 4 | 5 | ... | 100 | ... | 104 | ... |
|---|---|---|---|---|---|---|---|---|
| FREQUENCY (SUBTOTAL) | 0.0891 | 0.0532 | 0.0489 | ... | 0.000006 | ... | 0.000003 | ... |

H21b

⇩ ADD UP

| CODE | 00h | 01h | 02h | ... | 61h | ... | 65h | ... |
|---|---|---|---|---|---|---|---|---|
| FREQUENCY (TOTAL) | 0.089221 | 0.053203 | 0.04891 | ... | 0.082306 | ... | 0.110403 | ... |
| CODE LENGTH | 3 | 4 | 4 | ... | 3 | ... | 3 | ... |

H22b

⇩ SORT

| CODE | 65h | 00h | 61h | ... | 01h | 02h | ... |
|---|---|---|---|---|---|---|---|
| FREQUENCY (TOTAL) | 0.110403 | 0.089221 | 0.082306 | ... | 0.053203 | 0.04891 | ... |
| CODE LENGTH | 3 | 3 | 3 | ... | 4 | 4 | ... |

H23b

COMPRESSION METHOD, COMPRESSION DEVICE, AND COMPUTER-READABLE RECORDING MEDIUM

CROSS-REFERENCE TO RELATED APPLICATION

This application is based upon and claims the benefit of priority of the prior Japanese Patent Application No. 2014-149271, filed on Jul. 22, 2014, the entire contents of which are incorporated herein by reference.

FIELD

The embodiments discussed herein are related to a compression method, a compression device, and a computer-readable recording medium.

BACKGROUND

There is a technique of tallying appearance frequencies of characters in data, and then, performing longest-match string searching, and compressing the data in accordance with a result thereof. For example, ZIP is a compression technique of performing tally of appearance frequencies of characters and generation of a Huffman tree at a first stage and performing LZ77 compression and Huffman compression at a second stage.

In the LZ77-type compression, longest-matching searching is performed on a sliding window, an identification bit is given to a compression code in accordance with a result thereof, and Huffman coding is performed on a character or the position and the length of the character string using the Huffman compression. In the following description, a character string provided by the longest-match string searching is expressed as longest matching data.

For example, as a result of the longest-match string searching on the sliding window, when the longest matching data is smaller than 3 bytes, a code in which an identification bit "0" and binary expression of a 1-byte character code are related is output as a variable length compression code using the Huffman tree. On the other hand, when the longest matching data is equal to or larger than 3 bytes, a code in which an identification bit "1" and the position and the length of the longest matching data are related is output as a variable length compression code in the same manner.

Japanese Laid-open Patent Publication No. 05-241777 discloses a related technique, for example.

Conventionally, in tally of an appearance frequency of a character using a sliding window and generation of a Huffman tree, an appearance frequency of the length of the longest-match string is not tallied. Accordingly, an appropriate compression code is not assigned to the length of the longest-match string in accordance with the appearance frequency thereof, resulting in the problem that a compression rate lowers.

SUMMARY

According to an aspect of the embodiments, a non-transitory computer-readable recording medium stores a compression program that causes a computer to execute a process including: detecting a matched data that matches a processing target data with a longest length among pieces of data, the pieces of data being extracted from a data sequence that is a compression target; acquiring an appearance frequency of a code corresponding to character data contained in the matched data when a data length of the matched data is smaller than a predetermined length; acquiring an appearance frequency of a code corresponding to the matched data when the data length of the match data is equal to or larger than the predetermined length; and compressing the data sequence using a compression code generated based on the acquired appearance frequency of the code.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2 is a diagram illustrating an example of a Huffman tree that is generated in the first reference example;

FIG. 11 is a diagram illustrating a first example of a Huffman tree that is generated in a first embodiment;

FIG. 16 is a diagram illustrating an example of the procedure of processing of forming a code conversion table;

DESCRIPTION OF EMBODIMENTS

Preferred embodiments will be explained with reference to accompanying drawings. The embodiments do not limit the invention.

Before the embodiment of the present invention is described, reference examples of a compression technique and a decompression technique using LZ77 will be described.

Tally of Appearance Frequencies of Characters in First Reference Example

Figure 1:
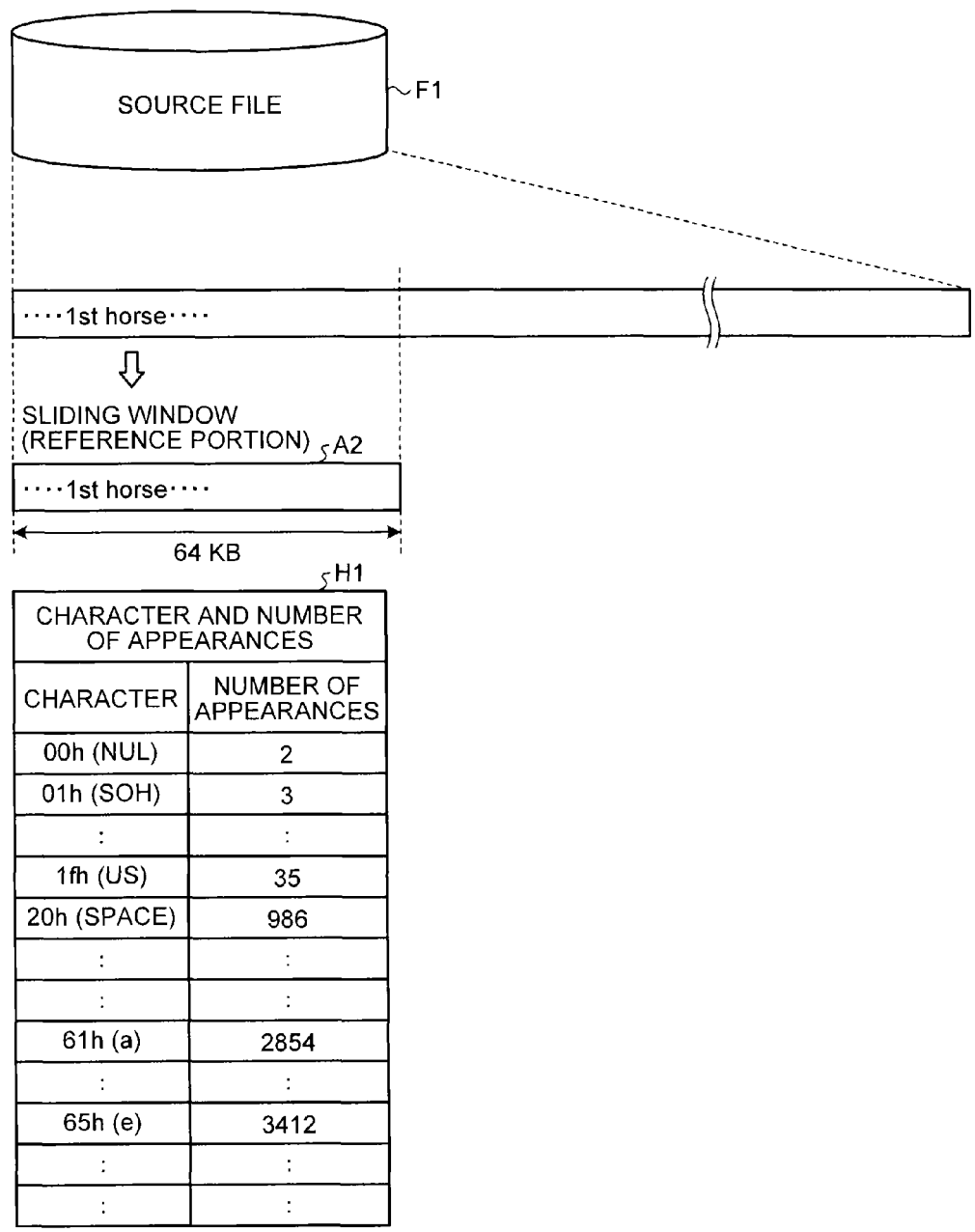
FIG. 1 is a diagram for explaining the numbers of appearances of characters that are tallied and a range thereof in a first reference example.

FIG. 1 is a diagram for explaining appearance frequencies of characters that are tallied and a range thereof in a first reference example. As illustrated in an example of FIG. 1, an information processing device 100a in the first reference example reads a source file F1 into a storage region A2. The storage region A2 contains a character string of "1st horse".

The storage region A2 is a reference portion of a sliding window, for example. The storage region A2 contains the character string of "1st horse". The information processing device 100a counts the numbers of appearances of respective characters of one byte stored in the storage region A2. For example, the information processing device 100a counts the numbers of appearances of the respective characters of "1", "s", "t", "(space)", "h", "o", "r", "s", and "e" contained in "1st horse". After the information processing device 100a finishes counting of the numbers of appearances of the respective characters in the sliding window A2, it terminates tally processing in order to speed up processing. Alternatively, the information processing device 100a can also count the numbers of appearances of all the characters in the source file F1 using the storage region A2 repeatedly so as to improve a compression rate.

The information processing device 100a generates an appearance number table H1 based on the numbers of appearances of the respective characters. As illustrated in the example of FIG. 1, the appearance number table H1 makes the characters, codes thereof, and the numbers of appearances correspond to one another. For example, "00h(NUL)" in a column of character expresses a code "00h" and a control character "NUL". "61h(a)" expresses a code "61h" and a lowercase character "a". A column of the number of appearances indicates the numbers of appearances of the respective characters.

The information processing device 100a generates a Huffman tree based on the generated character appearance number table H1. FIG. 2 is a diagram illustrating an example of the Huffman tree that is generated in the first reference example. As in the example of FIG. 2, a Huffman tree 10 generated in the first reference example includes a root 11, nodes 12a to 12f, and leaves 13a to 13d. Each of the nodes 12a to 12f has a pointer to a high-order node and pointers to right and left low-order nodes or leaves as indicated in a node data structure 10a. Each of the leaves 13a to 13d has a leaf identifier, preliminary information, and the character code or the length of the longest-match string as indicated in a leaf data structure 10b.

A frequency table H2a makes codes, characters, frequencies (actual), and code lengths of the respective leaves 13a to 13d correspond to one another.

The information processing device 100a obtains the code length based on the appearance frequency of each character. To be specific, the information processing device 100a calculates the code length based on the code, the character, and the frequency (actual) thereof on a leaf table 24. The frequency (actual) is a frequency of each character that is calculated based on the number of appearances of the character stored in the appearance number table H1.

For example, the information processing device 100a assigns a code length "3" to a code "65h" based on an appearance frequency "0.1104" of a character "e" for the leaf 13a. The information processing device 100a assigns a code length "12" to a code "00h" based on an appearance frequency "0.000121" of a character "NUL" for the leaf 13c. Thus, the information processing device 100a assigns a small code length in accordance with the degree of the appearance frequency of each character so as to improve the compression rate.

Compression Processing

Figure 3:
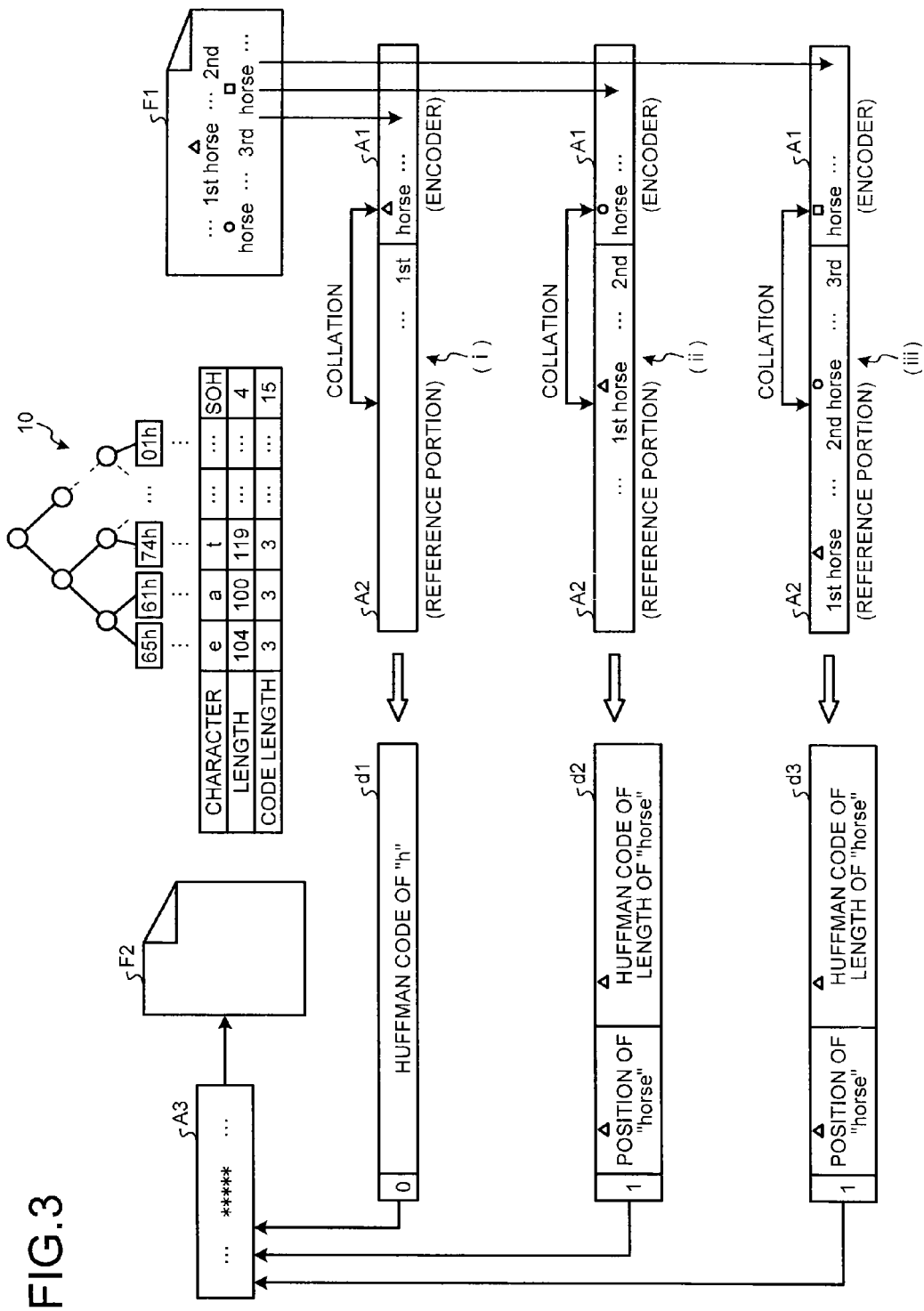
FIG. 3 is a diagram for explaining the procedure of compression processing.

The information processing device 100a in the first reference example performs file compression processing using the generated Huffman tree 10. FIG. 3 is a diagram for explaining the procedure of the compression processing. The information processing device 100a in the first reference example ensures a storage region A1, the storage region A2, and a storage region A3 in a memory, for example. The storage region A1 is referred to as an encoder, for example. The file F1 contains data of a content of " . . . 1st horse . . . 2nd horse . . . 3rd horse . . . ", and the data in the file F1 is sequentially loaded on the storage region A1. After the compression processing is performed on the data loaded on the storage region A1, the data loaded on the storage region A1 is copied to the storage region A2. The storage region A2 is referred to as a reference portion, for example.

The information processing device 100a collates the data in the storage region A1 and the data in the storage region A2 in the compression processing, and generates compression data in accordance with a collated result. The information processing device 100a sequentially stores the generated compression data in the storage region A3. The information processing device 100a generates a compression file F2 based on the compression data stored in the storage region A3. In order to distinguish the same word "horse" contained in the file F1, "Δ" is noted on the upper side of "horse" of "1st horse", "○" is noted on the upper side of "horse" of "2nd horse", and "□" is noted on the upper side of "horse" of "3rd horse". " . . . " in the file F1 is an unspecified character string. "*" in the storage region A3 indicates a compression code.

Generation of compression data d1 in an example of (i) in FIG. 3 is described. First, the information processing device 100a searches the storage region A2 for the longest-match string matching with "horse . . . " contained in the storage region A1 ("collation" in FIG. 3). In the example of (i) in FIG. 3, in the storage region A2, there is no data matching with a leading character "h" in the storage region A1. That is, the length of the longest-match string is 0 byte. When the length of the longest-match string is smaller than 3 bytes, the information processing device 100a converts the leading character in the storage region A1 to a Huffman code by referring to the Huffman tree 10. In the example of (i) in FIG. 3, the information processing device 100a converts "h" in the storage region A1 to the Huffman code so as to generate the compression data d1. The information processing device 100a causes the compression data d1 to contain an identifier "0" indicating that the leading character is compressed in the storage region A1.

Generation of compression data d2 in an example of (ii) in FIG. 3 is described. First, the information processing device 100a searches the storage region A2 for the longest-match string matching with "horse . . . " contained in the storage region A1 ("collation" in FIG. 3). In the example of (ii) in FIG. 3, "horse" denoted with ○ in the storage region A1 matches with "horse" denoted with Δ in the storage region A2 and the character string "horse" of 5 bytes corresponds to the longest-match string. When the length of the longest-match string is equal to or larger than 3 bytes, the information processing device 100a generates compression data d2 having an identifier "1", a position of the longest-match string in the storage region A2, and a Huffman code of the length of the longest-match string. The identifier "1" indicates that the compression data is compression data based on the position and the length of the longest-match string. The information processing device 100a converts the length of the longest-match string into the Huffman code by referring to the Huffman tree 10. In the example of (ii) in FIG. 3, the information processing device 100a generates the compression data d2 containing the identifier "1", the position of "horse", and the Huffman code of the length "5" of "horse".

Generation of compression data d3 in an example of (iii) in FIG. 3 is described. First, the information processing device 100a searches the storage region A2 for the longest-match string matching with "horse . . . " contained in the storage region A1 ("collation" in FIG. 3). In the example of (iii) in FIG. 3, "horse" denoted with Δ or ○ in the storage region A2 matches with "horse" denoted with □ in the storage region A1 and the character string "horse" of 5 bytes corresponds to the longest-match string. In the same manner as the example of (ii) in FIG. 3, the information processing device 100a generates the compression data d3 having the identifier "1", the position of "horse", and the Huffman code of the length "5" of "horse" because the length of the longest-match string is equal to or larger than 3 bytes.

The information processing device 100a tallies the numbers of appearances of characters using the sliding window and calculates the code lengths based on the frequencies thereof. When the length of the longest-match string is smaller than 3 bytes, the longest-match string is split into individual characters each having 1 byte, and the identifier "0" and a Huffman code corresponding to the appearance frequency of each character are generated, thereby improving a compression rate.

The number of appearances of the length of the longest-match string is not tallied and a code length based on the frequency thereof does not be calculated. For this reason, the information processing device 100a assigns a large code length to the length of the longest-match string having a high appearance frequency in accordance with a character having a low appearance frequency corresponding to the code in some cases, resulting in lowering of the compression rate of the file. For example, the frequency (virtual) of the length "3" is 0.0891 and the code length is 3 whereas the frequency (actual) of the character "NUL" corresponding to the code "00h" is 0.000121 and a code length 12 is assigned to the length.

Decompression Processing

Figure 4:
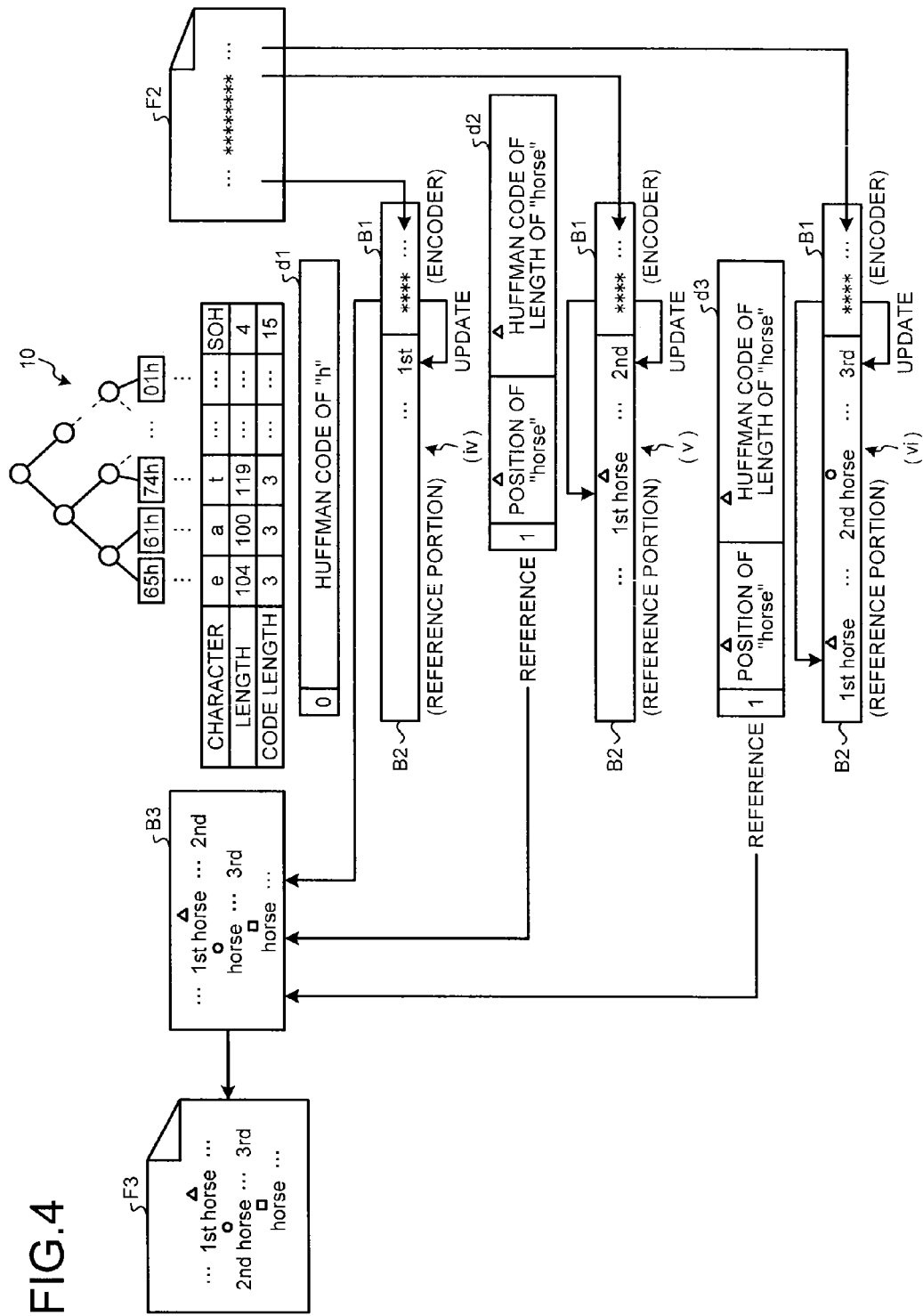
FIG. 4 is a diagram for explaining the procedure of decompression processing.

The information processing device 100a performs processing of decompressing a file based on the generated Huffman tree. FIG. 4 is a diagram for explaining the procedure of the decompression processing. The information processing device 100a sequentially loads compression data in the compression file F2 on a storage region B1. The storage region B1 is referred to as an encoder, for example. The information processing device 100a performs decompression processing on the compression data of the compression file F2 containing the compression data so as to generate decompression data. The information processing device 100a copies the generated decompression data to a storage region B2 and a storage region B3. The storage region B2 is referred to as a reference portion, for example. The information processing device 100a generates a decompression file F3 based on the decompression data collected into the storage region B3. "*" in FIG. 4 indicates compressed data.

In an example of (iv) in FIG. 4, the decompression processing is performed in the following manner, for example. The compression data d1 "****" in the storage region B1 as illustrated in the example of (iv) in FIG. 4 is a target of the decompression processing. The compression data d1 contains the identifier "0" assigned when the character is compressed and the Huffman code of "h". When the identifier is "0", the information processing device 100a acquires a decompression character (character data) corresponding to the Huffman code by referring to the Huffman tree 10. In the example of (iv) in FIG. 4, the information processing device 100a acquires the decompression character "h" from the Huffman tree 10. Then, the information processing device 100a copies the acquired decompression character "h" to the storage region B2 and the storage region B3.

In an example of (v) in FIG. 4, the decompression processing is performed in the following manner. The compression data d2 "**" in the storage region B1 as illustrated in the example of (v) in FIG. 4 is a target of the decompression processing. The compression data d2 contains the identifier "1", the position of the longest-match string in the storage region B2, and the Huffman code of the length of the longest-match string. The identifier "1" indicates that the compression data is compression data based on the position and the length of the longest-match string. In the example of (v), the information processing device 100a acquires the length "5" of the longest-match string from the Huffman tree 10. Then, the information processing device 100a acquires the longest-match string "horse" from the storage region B2 based on the position of the longest-match string in the storage region B2 and the length "5" of the longest-match string and replaces the compression data d2 "**" in the storage region B1 with the longest-match string "horse". The information processing device 100a copies the replacement "horse" in the storage region B1 to the storage region B2 and the storage region B3.

In an example of (vi) in FIG. 4, the decompression processing is performed in the following manner. The compression data d3 "****" in the storage region B1 as illustrated in the example of (vi) in FIG. 4 is a target of the decompression processing. The compression data d3 contains the identifier "1", the position of the longest-match string in the storage region B2, and the Huffman code of the length of the longest-match string. In the same manner as the example of (v), the information processing device 100a replaces the compression data d3 with the longest-match string "horse" and copies the replacement "horse" in the storage region B1 to the storage region B2 and the storage region B3.

Figure 5:
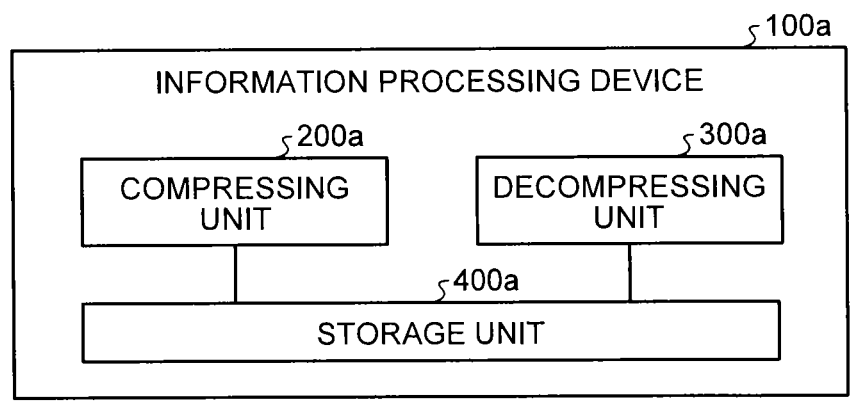
FIG. 5 is a diagram for explaining a relation among individual processors and a storage unit in an information processing device in the reference example.

Relation among Individual Processors and Storage Unit in Information Processing Device FIG. 5 is a diagram for explaining a relation among individual processors and a storage unit in the information processing device. As illustrated in an example of FIG. 5, a storage unit 400a of the information processing device 100a is connected to a compressing unit 200a and a decompressing unit 300a. The storage unit 400a corresponds to a semiconductor memory element such as a random access memory (RAM), a read only memory (ROM), and a flash memory, or a storage device such as a hard disk and an optical disk, for example. For example, the storage unit 400a corresponds to a first storage region 216 and a second storage region 229 in FIG. 6, which will be described later.

The information processing device 100a includes the compressing unit 200a and the decompressing unit 300a. For example, functions of the compressing unit 200a and the decompressing unit 300a can be achieved by an integrated circuit such as an application specific integrated circuit (ASIC) and a field programmable gate array (FPGA). Furthermore, a central processing unit (CPU) executes predetermined programs so as to achieve the functions of the compressing unit 200a and the decompressing unit 300a, for example. The compressing unit 200a, for example, corresponds to each processor of a first stage processor 210 and a second stage processor 220 in FIG. 6, which will be described later.

System Configuration of Compressing Unit 200a in First Reference Example

Figure 6:
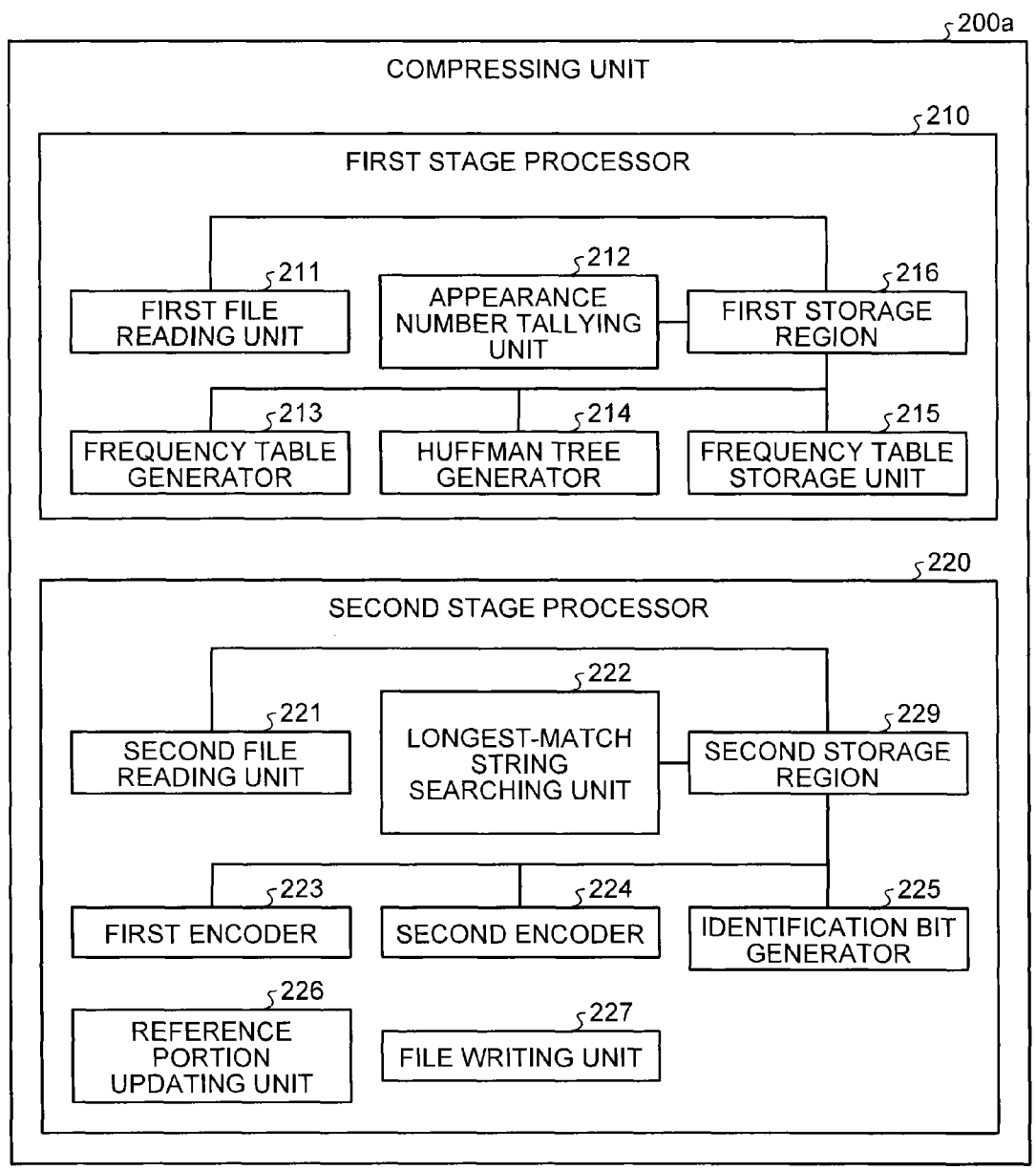
FIG. 6 is a diagram illustrating an example of the system configuration related to compression by the information processing device in the first reference example.

FIG. 6 is a diagram illustrating an example of the system configuration related to compression of the information processing device in the first reference example. As illustrated in the example of FIG. 6, the compressing unit 200a includes the first stage processor 210 and the second stage processor 220. The first stage processor 210 includes a first file reading unit 211, an appearance number tallying unit 212, a frequency table generator 213, a Huffman tree generator 214, a frequency table storage unit 215, and the first storage region 216. The second stage processor 220 includes a second file reading unit 221, a longest-match string searching unit 222, a first encoder 223, a second encoder 224, an identification bit generator 225, and a reference portion updating unit 226. The second stage processor 220 further includes a file writing unit 227 and the second storage region 229. The first file reading unit 211 and the second file reading unit 221 may have the same configuration.

The first stage processor 210 is a processor that tallies the numbers of appearances of respective characters to generate the appearance number table H1 and forms a Huffman tree based on the appearance number table H1. Individual units included in the first stage processor 210 are described.

The first file reading unit 211 is a processor that reads out a content portion of the file F1 as a compression target onto a predetermined storage region. The first file reading unit 211 reads the content portion of the file F1 into the storage region A2 corresponding to the reference portion of the sliding window. The storage region A2 is assumed to be present in the first storage region 216 here. When the tally processing in the storage region A2 is completed, the first file reading unit 211 terminates the reading processing.

The appearance number tallying unit 212 is a processor that tallies the number of appearances of each character by referring to the content read out onto the storage region A2 by the first file reading unit 211. When the appearance number tallying unit 212 completes the tally, it outputs a tally result to the frequency table generator 213.

The frequency table generator 213 is a processor that generates the frequency table H2a based on the tally result of the numbers of appearances of the respective characters that has been acquired from the appearance number tallying unit 212. The frequency table H2a makes character frequencies correspond to the respective characters based on the total numbers of appearances of the characters. The frequency table H2a has 256 recodes. The frequency table generator 213 outputs information of the frequency table H2a to the Huffman tree generator 214 and the frequency table storage unit 215.

The Huffman tree generator 214 is a processor that generates a Huffman tree based on the frequency table H2a. The Huffman tree generator 214 forms 256 leaf structures and assigns codes, characters, frequencies, and code lengths of the respective leaves based on the frequency table H2a.

The Huffman tree generator 214 sorts and arranges the characters in the descending order of the appearance frequencies of the characters, and generates branches in accordance with the appearance frequencies of the respective characters. For example, the Huffman tree has a root, nodes, branches, and leaves corresponding to the Huffman tree 10 as illustrated in FIG. 2. The structures of the root and the nodes store therein pointers to high-order nodes and pointers to right and left low-order nodes or pieces of data of leaves.

The frequency table storage unit 215 stores the content of the frequency table H2a in a header portion of the file F2.

The second stage processor 220 is a processor that compresses the file F1 based on the Huffman tree generated by the first stage processor 210. Pieces of processing of the respective units included in the second stage processor 220 are described. The second file reading unit 221 is a processor that reads out data of the content portion in the file F1 onto the storage region A1 corresponding to the encoder. After the processing on the data stored in the storage region A1 is finished, the data in the storage region A1 is shifted to the storage region A2 as the reference portion, and the data in the storage region A3 storing therein the compression code is written into the compression file F2, the second file reading unit 221 reads out new data from the file F1 and updates the data stored in the storage region A1.

The longest-match string searching unit 222 is a processor that compares the data stored in the storage region A2 as the reference portion and the data stored in the storage region A1 as the encoder so as to search for the longest-match string. The processing of searching for the longest-match string is the same as the processing as illustrated in FIG. 3. The longest-match string searching unit 222 outputs the position and the length of the longest-match string to the first encoder 223, the second encoder 224, and the identification bit generator 225.

The first encoder 223 performs processing when the length of the longest-match string is smaller than 3 bytes. When the length of the longest-match string is smaller than 3 bytes, the first encoder 223 compares each character data of 1 byte and the Huffman tree 10 so as to specify a Huffman code of the character data. The first encoder 223 stores compression data formed by combining the Huffman code and the identification bit that is acquired from the identification bit generator 225 in the storage region A3 and outputs it to the file writing unit 227.

The second encoder 224 performs processing when the length of the longest-match string is equal to or larger than 3 bytes. When the length of the longest-match string is equal to or larger than 3 bytes, the second encoder 224 specifies a position of the longest-match string from a leading character in the storage region A2 and the length of the longest-match string. The second encoder 224 compares the length of the longest-match string and the Huffman tree 10 so as to specify a Huffman code of the length of the longest-match string. The second encoder 224 stores compression data formed by combining the position of the longest-match string, the Huffman code of the length of the longest-match string, and the identification bit in the storage region A3, and outputs it to the file writing unit 227.

The identification bit generator 225 is a processor that outputs the identification bit "0" or the identification bit "1" based on the length of the longest-match string. To be specific, when the length of the longest-match string is smaller than 3 bytes, the identification bit generator 225 outputs the identification bit "0" to the first encoder 223. On the other hand, when the length of the longest-match string is equal to or larger than 3 bytes, the identification bit generator 225 outputs the identification bit "1" to the second encoder 224.

The reference portion updating unit 226 is a processor that stores, in the storage region A2, data stored in the storage region A1 when collation between the storage region A1 and the storage region A2 has been completed.

When the length of the longest-match string is smaller than 3 bytes, the file writing unit 227 writes the compression data formed by combining the identification bit "0" and the Huffman code that is output from the first encoder 223 into the storage region A3. When the length of the longest-match string is equal to or larger than 3 bytes, the file writing unit 227 writes the compression data formed by combining the identification bit "1" and the position and the length of the longest-match string that is output from the second encoder 224 into the storage region A3.

The file writing unit 227 writes the data in the storage region A3 into the compression file F2 after the processing on the storage region A1 is finished.

Figure 7:
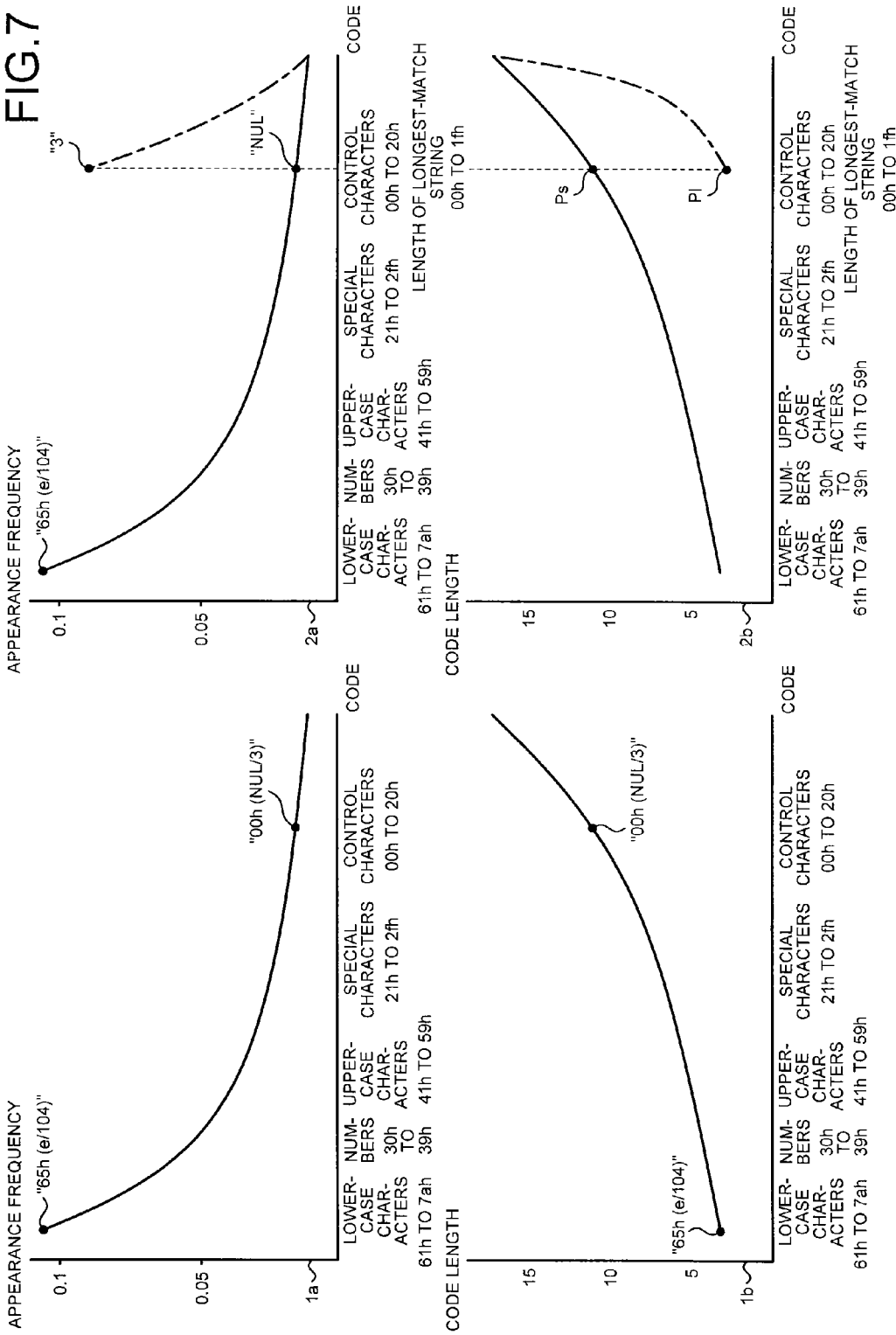
FIG. 7 is a first diagram for explaining code lengths of Huffman codes in the first reference example.

Code Lengths that are Assigned to Characters and Lengths of Longest Matching Character Strings The code lengths that are assigned to the characters and the lengths of the longest-match strings by the Huffman tree in the first reference example are described with reference to FIG. 7. FIG. 7 is a first diagram for explaining the code lengths of the Huffman codes in the first reference example. A frequency distribution graph 1a as illustrated in an example of FIG. 7 indicates appearance frequencies of codes that have been tallied by the information processing device 100a in the first reference example. The longitudinal axis of the frequency distribution graph 1a indicates appearance frequencies of respective characters. The transverse axis of the frequency distribution graph 1a lists characters of lowercase characters, numbers, uppercase characters, special characters, and control characters in the descending order of the appearance frequencies of the characters.

A code length distribution graph 1b indicates code lengths that are assigned to the respective characters. The longitudinal axis of the code length distribution graph 1b indicates the code lengths. The transverse axis of the code length distribution graph 1b corresponds to that of the frequency distribution graph 1a.

For example, a code length "3" is assigned to a code "65h" corresponding to a character "e" and a length "104" of the longest-match string in accordance with the appearance frequency of the character as indicated in the code length distribution graph 1b. A code length "12" is assigned to a code "00h" corresponding to a character "NUL" and a length "3" of the longest-match string.

A frequency distribution graph 2a indicates the appearance frequencies of the respective characters and appearance frequencies of respective lengths of the longest-match strings. The longitudinal axis of the frequency distribution graph 2a indicates the appearance frequencies of the respective characters or the appearance frequencies of the respective lengths of the longest-match strings. The transverse axis of the frequency distribution graph 2a lists characters of lowercase characters, numbers, uppercase characters, special characters, and control characters in the descending order of the appearance frequencies of the characters, and furthermore the lengths of the longest-match strings. A solid line on the frequency distribution graph 2a indicates the appearance frequencies of the respective characters. A dashed-dotted line on the frequency distribution graph 2a indicates the appearance frequencies of the respective lengths of the longest-match strings. The compressing unit 200a in the first reference example does not tally the appearance frequency of the length of the longest-match string.

A code length distribution graph 2b indicates code lengths that are assigned to the respective characters and the respective lengths of the longest-match strings. The longitudinal axis of the code length distribution graph 2b indicates the code lengths. The transverse axis of the code length distribution graph 2b corresponds to that of the frequency distribution graph 2a.

As described above, the compressing unit 200a assigns code lengths to the respective codes in accordance with the appearance frequencies of the characters. For example, both of the length "3" having the highest appearance frequency among the lengths of the longest-match strings and the control character "NUL" correspond to a code "00h". "3" and "NUL" on the code length distribution graph 2b correspond to a point Ps and a code length that is assigned to each of them is "12". As seen from the above, the Huffman code of a large code length is assigned to the length of the longest-match string, although the appearance frequency of the length of the longest-match string is high, resulting in lowering of the compression rate of the file.

A dashed-dotted line on the code length distribution graph 2b indicates code lengths when small code lengths are assigned to the lengths of the longest-match strings having high appearance frequencies (virtual). In principle, compression codes of small code lengths are assigned to lengths of longest-match strings having high appearance frequencies so as to improve the compression rate. For example, although large code lengths are assigned to the lengths of the longest-match strings having high appearance frequencies as indicated by the solid line on the code length distribution graph 2b in the first reference example, the compression rate is improved by assigning small code lengths to the lengths of the longest-match strings having high appearance frequencies (virtual) as indicated by the dashed-dotted line. For example, on the code length distribution graph 2b, the solid line indicates that a code length assigned to the length "3" of the longest-match string is "12" at the point Ps in accordance with the appearance frequency (actual) of the length "3" of the longest-match string. On the other hand, the dashed-dotted line indicates that the code length assigned to the length "3" of the longest-match string is "3" at a point P1 in accordance with the appearance frequency (virtual) thereof.

Figure 8:
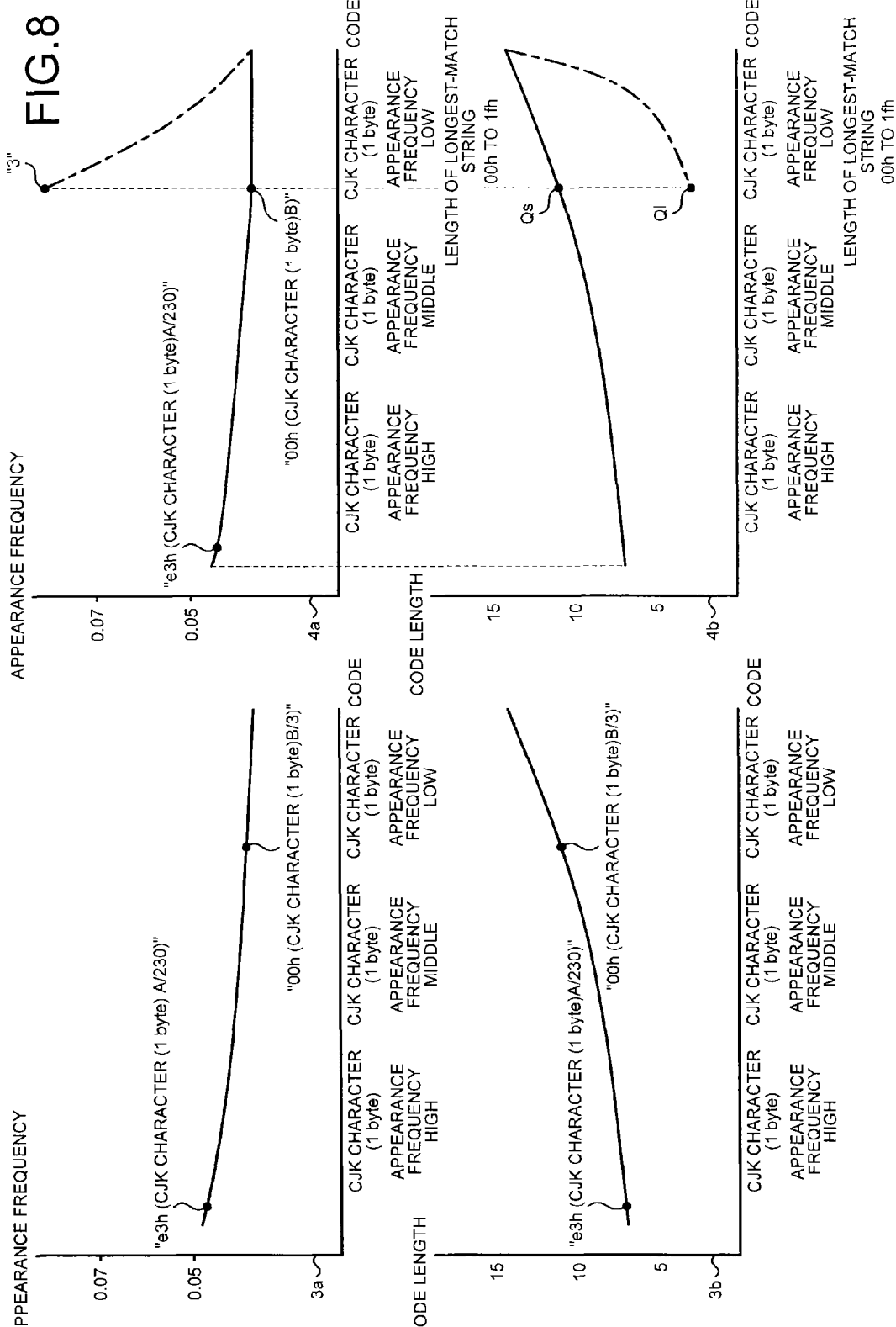
FIG. 8 is a second diagram for explaining the code lengths of the Huffman codes in the first reference example.

The code lengths that are assigned to CJK characters and lengths of longest-match strings by the Huffman tree in the first reference example are described with reference to FIG. 8. FIG. 8 is a second diagram for explaining the code lengths of the Huffman codes in the first reference example. Alphanumeric characters are encoded based on 1 byte whereas CJK characters of UTF-8 are encoded based on equal to or more than 3 bytes. The number of appearances is tallied based on 1 byte. That is, the CJK characters have less deviation in the frequency than the alphanumeric characters and frequency distribution thereof therefore draws a gentle curve. A frequency distribution graph 3a as illustrated in an example of FIG. 8 indicates appearance frequencies of CJK characters (1 byte) that have been tallied by the information processing device 100a in the first reference example. The longitudinal axis of the frequency distribution graph 3a indicates appearance frequencies of the respective CJK characters (1 byte). The CJK character (1 byte) is a bit string of 1 byte that is contained in the CJK character. The transverse axis of the frequency distribution graph 3a lists the CJK characters (1 byte) in the descending order of the appearance frequencies of the CJK characters (1 byte).

A code length distribution graph 3b indicates code lengths that are assigned to the respective CJK characters (1 byte). The longitudinal axis of the code length distribution graph 3b indicates the code lengths. The transverse axis of the code length distribution graph 3b lists the CJK characters (1 byte) in the descending order of the appearance frequencies of the CJK characters (1 byte).

Japanese text includes, as characters, many Hiragana, Katakana, and kanji characters. For example, a character of Hiragana " あ " is encoded into "e38182h" in a UTF-8 code. Furthermore, many characters of Katakana and kanji are encoded into "e3xxxxh" and an appearance frequency of e3h is therefore relatively high as the CJK characters of 1 byte. To be specific, a code length "6" is assigned to a code "e3h" corresponding to a CJK character (1 byte) A and a length "230" of the longest-match string as indicated by the code length distribution graph 3b.

A frequency distribution graph 4a indicates appearance frequencies of respective CJK characters (1 byte) and appearance frequencies of respective lengths of the longest-match strings. The longitudinal axis of the frequency distribution graph 4a indicates the appearance frequencies of the respective CJK characters (1 byte). The transverse axis of the frequency distribution graph 4a lists the CJK characters (1 byte) in the descending order of the appearance frequencies of the CJK characters (1 byte). In addition, the transverse axis of the frequency distribution graph 4a lists the lengths of the longest-match strings. A solid line in the frequency distribution graph 4a indicates the appearance frequencies of the respective CJK characters (1 byte). A dashed-dotted line on the frequency distribution graph 4a indicates the appearance frequencies of the respective lengths of the longest-match strings. The compressing unit 200a in the first reference example does not tally the appearance frequency of the length of the longest-match string.

A code length distribution graph 4b indicates code lengths that are assigned to the respective CJK characters and the respective lengths of the longest-match strings. The longitudinal axis of the code length distribution graph 4b indicates the code lengths. The transverse axis of the code length distribution graph 4b corresponds to that of the frequency distribution graph 4a.

As described above, the compressing unit 200a assigns code lengths to respective codes in accordance with the appearance frequencies of the CJK characters. A large code length is assigned to the length of the longest-match string, although the appearance frequency of the length of the longest-match string is high in some cases. For example, as illustrated in an example of FIG. 8, both of the length "3" having the highest appearance frequency among the lengths of the longest-match strings and "CJK character (1 byte) B" correspond to a code "00h". "3" and "CJK character (1 byte) B" correspond to a point Qs and a code length "11" is assigned thereto. Therefore, the Huffman code of a large code length is assigned to a code although the appearance frequency of the length of the longest-match string that corresponds to the code is high, resulting in lowering of the compression rate of the file.

A dashed-dotted line on the code length distribution graph 4b indicates code lengths when small code lengths in accordance with the appearance frequencies are assigned to the lengths of the longest-match strings having high appearance frequencies (virtual). In principle, compression codes of small code lengths are assigned to lengths of longest-match strings having high appearance frequencies so as to improve the compression rate. For example, although large code lengths are assigned to the lengths of the longest-match strings having high appearance frequencies as indicated by the solid line on the code length distribution graph 4b in the first reference example, the compression rate is improved by assigning small code lengths to the lengths of the longest-match strings having high appearance frequencies (virtual) as indicated by the dashed-dotted line. For example, on the code length distribution graph 4b, the solid line indicates that a code length assigned to the length "3" of the longest-match string is "11" at a point QS in accordance with the appearance frequency (actual) of the length "3" of the longest-match string. On the other hand, the dashed-dotted line indicates that the code length assigned to the length "3" of the longest-match string is "3" at a point Q1 in accordance with the appearance frequency (virtual). In this way, the code length that is assigned to the length of the longest-match string having the high appearance frequency is large, resulting in lowering of the compression rate.

System Configuration of Decompressing Unit 300a in First Reference Example

Figure 9:
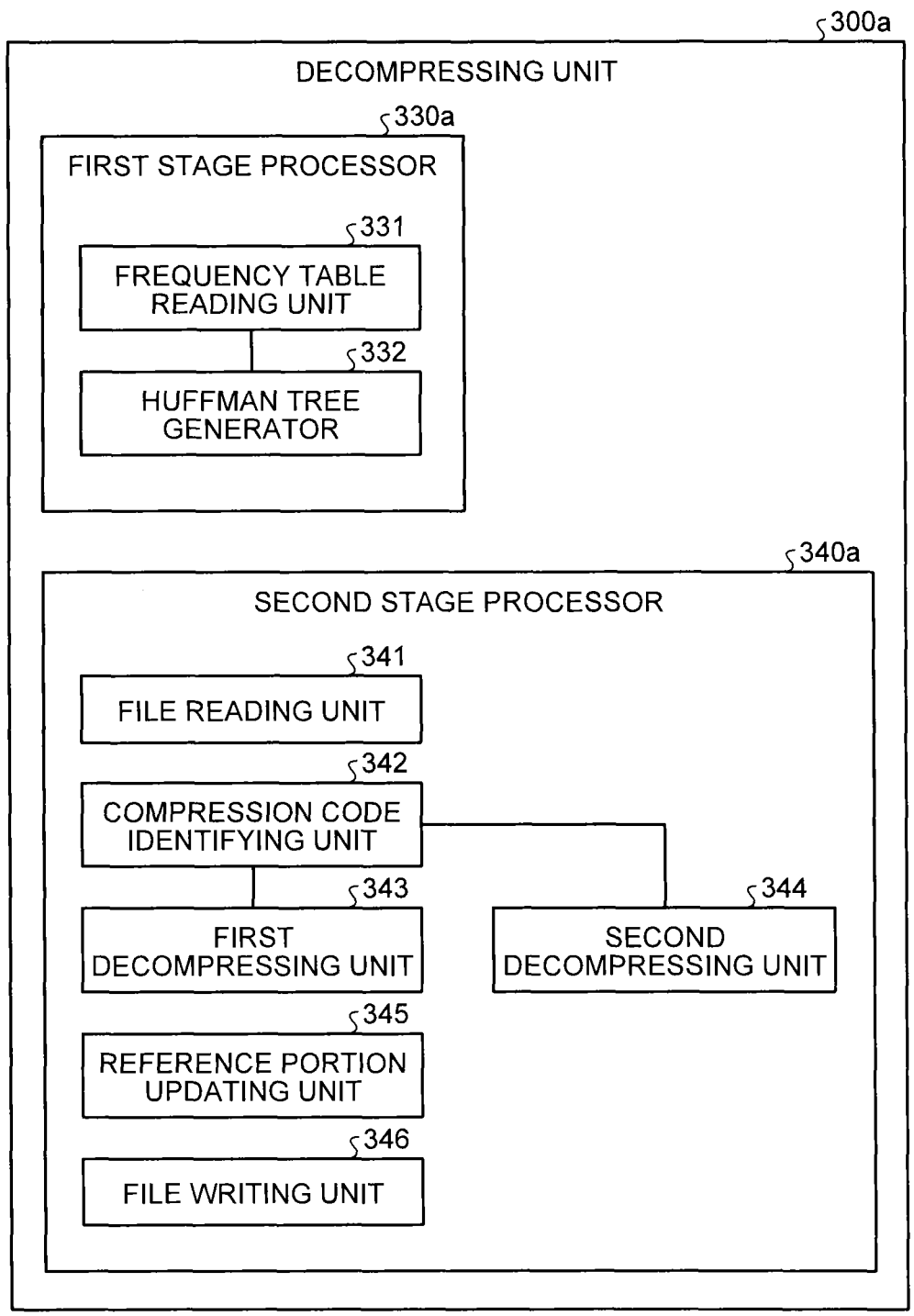
FIG. 9 is a functional block diagram illustrating a reference example of the configuration of a decompressing unit.

Next, an example of the configuration of the decompressing unit 300a will be described. FIG. 9 is a functional block diagram illustrating a reference example of the configuration of the decompressing unit. As illustrated in FIG. 9, the decompressing unit 300a includes a first stage processor 330a and a second stage processor 340a. The first stage processor 330a includes a frequency table reading unit 331 and a Huffman tree generator 332. The second stage processor 340a includes a file reading unit 341, a compression code identifying unit 342, a first decompressing unit 343, a second decompressing unit 344, a reference portion updating unit 345, and a file writing unit 346.

The first stage processor 330a is a processor that generates a Huffman tree based on a frequency table contained in header information of the compression file F2. Individual processors included in the first stage processor 330a are described.

The frequency table reading unit 331 is a processor that reads out information of the frequency table H2a and outputs the information to the Huffman tree generator 332. For example, the frequency table reading unit 331 acquires the information of the frequency table H2a generated by the frequency table generator 213 in FIG. 6.

The Huffman tree generator 332 is a processor that generates a Huffman tree based on the frequency table H2a. The processing of generating the Huffman tree by the Huffman tree generator 332 is the same as that by the Huffman tree generator 214 in FIG. 6.

The second stage processor 340a is a processor that decompresses the compression file F2. Pieces of processing of the respective units included in the second stage processor 340a are described.

The file reading unit 341 is a processor that reads out compression data in the compression file F2 onto the storage region B1. When processing on the compression data stored in the storage region B1 is finished, the file reading unit 341 reads out new compression data from the compression file F2 and updates the compression data stored in the storage region B1.

The compression code identifying unit 342 is a processor that reads out an identifier from the compression data in the storage region B1 and determines whether the identifier is "0" or "1". The compression code identifying unit 342 outputs a determination result to the first decompressing unit 343 and the second decompressing unit 344.

The first decompressing unit 343 performs processing when the identifier of the compression data is "0". The first decompressing unit 343 is a processor that compares a data sequence subsequent to the identifier of the compression data and the Huffman tree 10 and decodes data contained in a leaf reached by following the Huffman tree 10 as decompression data when the identifier is "0". The first decompressing unit 343 stores the decompression data in the storage region B2 and the storage region B3 as the reference portions and outputs the decompression data to the reference portion updating unit 345 and the file writing unit 346.

The second decompressing unit 344 performs processing when the identifier of the compression data is "1". The second decompressing unit 344 extracts decompression data from the storage region B2 since the data in the storage region B2 as the reference portion is the decompression data when the identifier is "1".

The second decompressing unit 344 specifies a position from a leading character in the storage region B2 and the length of the longest-match string in order to extract the decompression data. The position information corresponds to information of a fixed length (16 bits) subsequent to the identifier "1" in the compression data. The length information corresponds to information of a fixed length (8 bits) subsequent to the position information. The length information is Huffman-encoded, and the second decompressing unit 344 compares the Huffman code of the length and the Huffman tree 10 so as to acquire the length information contained in a leaf reached by following the Huffman tree 10.

The second decompressing unit 344 extracts the data corresponding to the position and the length from the storage region B2 as the reference portion, and sets the extracted data as the decompression data. The second decompressing unit 344 stores the decompression data in the storage region B2 and the storage region B3 as the reference portions, and outputs the decompression data to the reference portion updating unit 345 and the file writing unit 346.

The reference portion updating unit 345 is a processor that updates the storage region B2 by the decompression data when it has acquired the decompression data from the first decompressing unit 343 or the second decompressing unit 344.

The file writing unit 346 is a processor that stores the decompression data in the storage region B3 and writes the decompression data into the file F3 when it has acquired the decompression data from the first decompressing unit 343 or the second decompressing unit 344.

Figure 10:
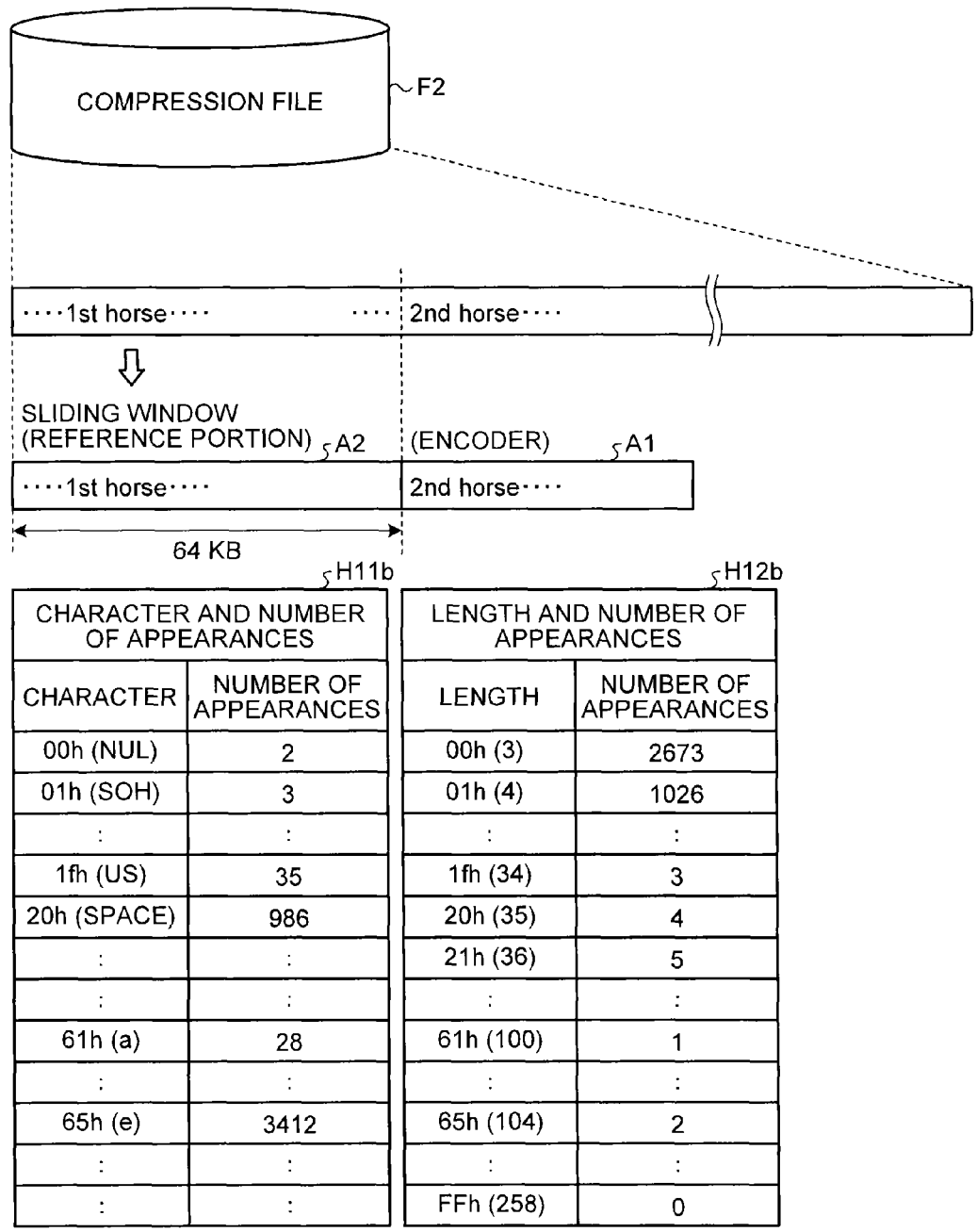
FIG. 10 is a diagram for explaining the numbers of appearances of characters and lengths that are tallied and a range thereof in an embodiment.

Tally of Numbers of Appearances of Characters and Lengths of Longest Matching Character Strings in First Embodiment Generation of an appearance number table H11b and an appearance number table H12b in a first embodiment is described with reference to FIG. 10. FIG. 10 is a diagram for explaining the numbers of appearances of characters and lengths that are tallied and a range thereof in a first embodiment. As illustrated in an example of FIG. 10, an information processing device 100b in the first embodiment reads a source file F2 into the storage region A1. The file F2 includes a plurality of character strings of "ΔhorseΔ".

The information processing device 100b reads data into the storage region A1, performs longest-match string searching in the storage region A2, and tallies the number of appearances of characters and the number of appearances of the length of the longest-match string. The storage region A1 is an encoder of a sliding window, for example. The storage region A2 is a reference portion of the sliding window, for example. In the example of FIG. 10, it is assumed that both of the storage region A1 and the storage region A2 contain a character string of "ΔhorseΔ". The information processing device 100b counts the number of appearances of a code "04h" corresponding to a length "7" of the longest-match string "ΔhorseΔ", for example. The information processing device 100b counts the number of appearances of characters in the storage region A1 when the length of the longest-match string is smaller than 3 bytes.

The information processing device 100b reads data of a subsequent portion from the file F1 into the storage region A1 every time it counts the numbers of appearances of the characters or the number of appearances of the length of the longest-match string. The information processing device 100b updates the appearance number table H11b based on the counted number of appearances of each character. The appearance number table H11b holds the number of appearances of each character. As illustrated in an example of FIG. 10, the appearance number table H11b makes characters and the numbers of appearances correspond to each other.

The information processing device 100b updates the appearance number table H12b based on the counted number of appearances of each length of the longest-match string. The appearance number table H12b holds the number of appearances of each length of the longest-match string. "00h (3)" in a column of the length expresses a length "3" of the longest-match string that corresponds to a code "00h". "01h (4)" expresses a length "4" of the longest-match string that corresponds to a code "01h". In the following description, the length of the longest-match string is referred to as a length in some cases.

Generation of Huffman Tree in First Embodiment

The information processing device 100b generates a Huffman tree based on the appearance number table H11b and the appearance number table H12b. FIG. 11 is a diagram illustrating a first example of the Huffman tree that is generated in the first embodiment. As illustrated in an example of FIG. 11, a Huffman tree 20 generated in the first embodiment has a root 21, nodes 22a to 22f, and leaves 23a to 23e. Each of the nodes 22a to 22e has a pointer to a high-order node, and pointers to right and left low-order nodes or leaves as indicated in a node data structure 20a. Each of the leaves 23a to 23d has a leaf identifier, preliminary information, and the character code or the length of the longest-match string as indicated in a leaf data structure 20b.

A frequency table H2b makes codes, frequencies (actual) thereof, and code lengths of the leaves 22a to 22e, characters and frequencies (subtotal) thereof corresponding to the codes, and lengths of longest-match strings and frequencies (subtotal) thereof corresponding to the codes correspond to one another. For example, the frequency table H2b indicates that for the leaf 23a, a code is "65h", a frequency (total) of the code is "0.110403", and a code length of the code is "3". Furthermore, the frequency table H2b indicates that for the leaf 23a, a character corresponding to the code "65h" is "e" and a frequency (subtotal) of the character "e" is "0.1104". In addition, the frequency table H2b indicates that for the leaf 23a, the length corresponding to the code "65h" is "104" and the frequency (subtotal) of the length "104" is "0.000003".

One code expresses one character and expresses one length of the longest-match string. For example, the code "65h" indicates the character "e" and the length "104". Furthermore, a code "61h" indicates a character "a" and a length "100".

The information processing device 100b assigns a code length to each code based on an appearance frequency (actual) calculated by adding up the appearance frequency (subtotal) of the character and the appearance frequency (subtotal) of the length. For example, the information processing device 100b adds up the appearance frequency (subtotal) "0.1104" of the character "e" and the appearance frequency (subtotal) "0.000003" of the length "104" so as to calculate the appearance frequency (actual) "0.110403" of the code "65h". The information processing device 100b assigns a code length "3" to the code "65h" based on the appearance frequency (actual) "0.110403" of the code "65h". The information processing device 100b adds up an appearance frequency (subtotal) "0.000121" of a character "NUL" and an appearance frequency (subtotal) "0.0891" of a length "3" so as to calculate an appearance frequency (actual) "0.089221" of a code "00h". The information processing device 100b assigns a code length "3" to the code "00h" based on the appearance frequency (actual) "0.089221" of the code "00h". Thus, for the leaf 23b, the appearance frequency (subtotal) of the length "3" of the longest-match string is reflected to the appearance frequency (actual) of the code "00h" and a small code length is assigned to the code "00h" having a high appearance frequency.

As described above, the information processing device 100b assigns a code length in accordance with the appearance frequency (actual) of each code that is calculated by adding up the appearance frequencies (subtotals) of the character and the length corresponding to the code. The information processing device 100b reflects the appearance frequency (subtotal) of the length of the longest-match string to the appearance frequency (actual) of the code and thus the code length that is assigned to the code having the high appearance frequency is small, thereby improving the compression rate.

Figure 12:
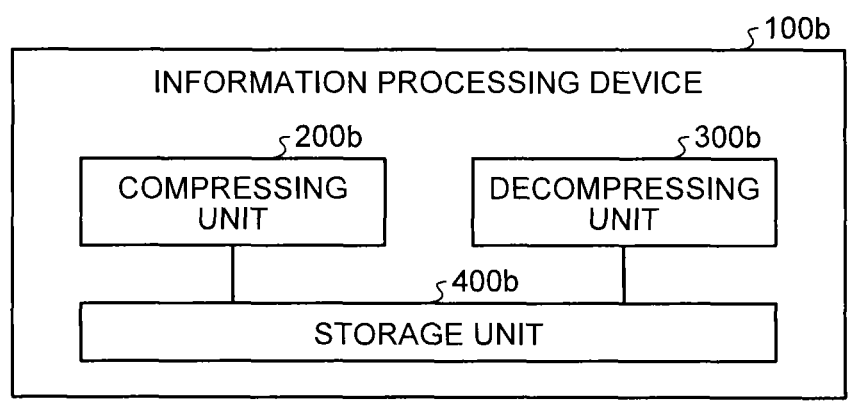
FIG. 12 is a diagram for explaining a relation among individual processors and a storage unit in an information processing device in the first embodiment.

Relation among Individual Processors and Storage Unit in Information Processing Device FIG. 12 is a diagram for explaining a relation among individual processors and a storage unit in the information processing device in the first embodiment. As illustrated in an example of FIG. 12, a storage unit 400b of the information processing device 100b is connected to a compressing unit 200b and a decompressing unit 300b. The storage unit 400b corresponds to a semiconductor memory element such as a RAM, a ROM, and a flash memory, or a storage device such as a hard disk and an optical disk, for example. For example, the storage unit 400b corresponds to a first storage region 258 and a second storage region 269 in FIG. 13, which will be described later.

The information processing device 100b includes the compressing unit 200b and the decompressing unit 300b. For example, functions of the compressing unit 200b and the decompressing unit 300b can be achieved by an integrated circuit such as the ASIC and the FPGA. Furthermore, the functions of the compressing unit 200b and the decompressing unit 300b can be achieved by a CPU that executes predetermined programs, for example. The compressing unit 200b corresponds to each processor of a first stage processor 250 and a second stage processor 260 in FIG. 13, which will be described later, for example.

System Configuration of Compressing Unit 200b in First Embodiment

Figure 13:
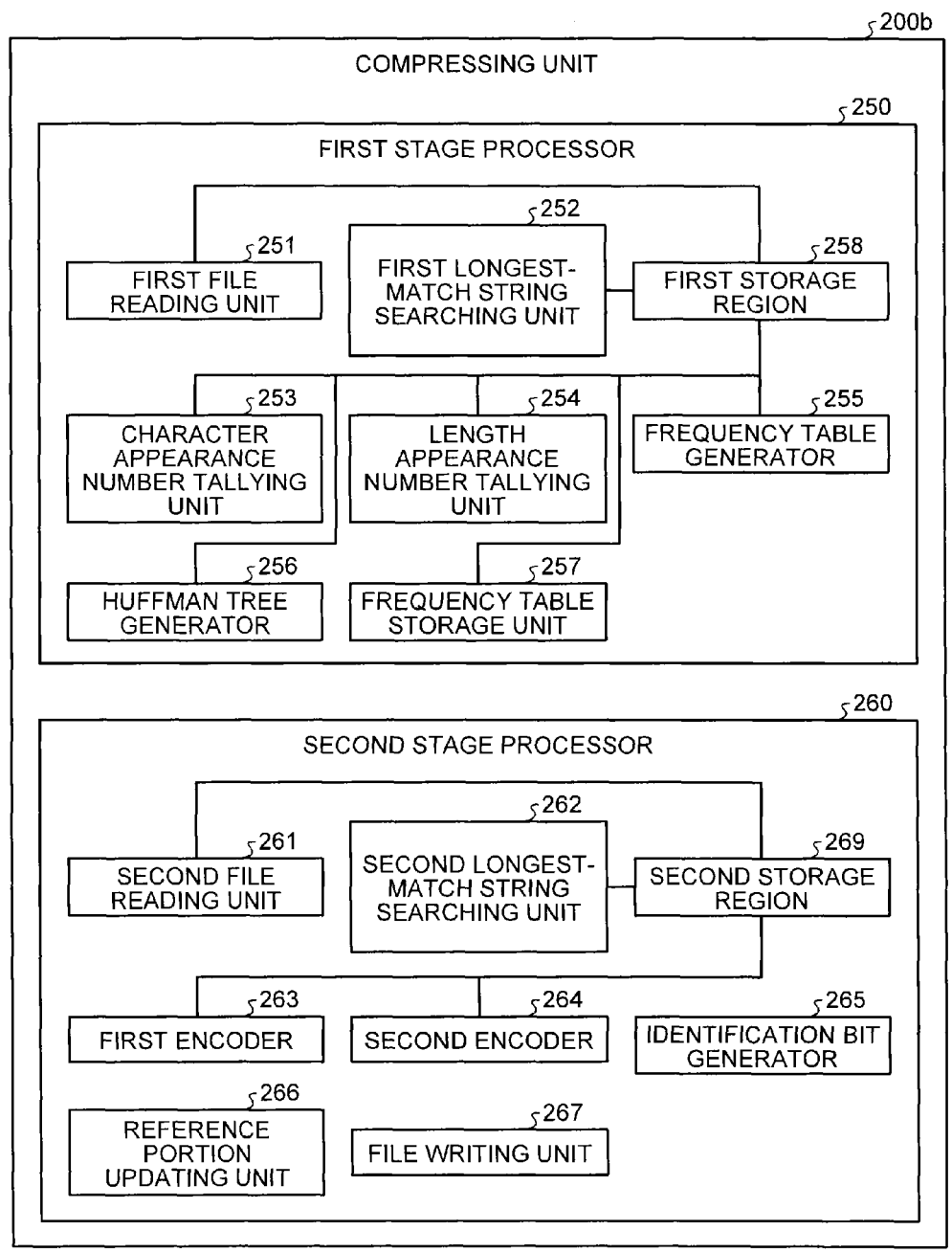
FIG. 13 is a diagram illustrating an example of the system configuration related to compression by the information processing device in the first embodiment.

FIG. 13 is a diagram illustrating an example of the system configuration related to compression of the information processing device in the first embodiment. The compressing unit 200b includes the first stage processor 250 and the second stage processor 260. The first stage processor 250 includes a first file reading unit 251, a first longest-match string searching unit 252, a character appearance number tallying unit 253, a length appearance number tallying unit 254, a frequency table generator 255, a Huffman tree generator 256, a frequency table storage unit 257, and the first storage region 258. The second stage processor 260 includes a second file reading unit 261, a longest-match string searching unit 262, a first encoder 263, a second encoder 264, an identification bit generator 265, and a reference portion updating unit 266. The second stage processor 260 further includes a file writing unit 267 and the second storage region 269. The first file reading unit 251 and the second file reading unit 261 may have the same configuration.

The first file reading unit 251 is a processor that reads out a content portion of the file F1 as a compression target onto a predetermined storage region. The first file reading unit 251 reads the content portion of the file F1 into the storage region A1 corresponding to the reference portion of the sliding window. The content read into the storage region A1 is stored in the storage region A2 every time the tally processing, which will be described later, is completed. The storage region A1 and the storage region A2 are assumed to be present in the first storage region 258. When the tally processing in the storage region A1 and the storage region A2 is completed, the first file reading unit 251 terminates the reading processing.

The character appearance number tallying unit 253 is a processor that tallies the number of appearances of each character contained in the storage region A1 by referring to the content stored in the storage region A1. For example, the character appearance number tallying unit 253 executes the processing when the length of the longest-match string is smaller than 3 bytes. The character appearance number tallying unit 253 counts the number of appearances of each character every time the data in the storage region A1 is updated. Upon completing the tally, the character appearance number tallying unit 253 outputs a tally result to the frequency table generator 255.

The first longest-match string searching unit 252 is a processor that compares data stored in the storage region A2 as the reference portion and data stored in the storage region A1 as the encoder and searches for the longest-match string. The first longest-match string searching unit 252 executes the processing when the length of the longest-match string is equal to or larger than 3 bytes, for example. The first longest-match string searching unit 252 outputs the length of the longest-match string to the length appearance number tallying unit 254 every time the data in the storage region A1 is updated.

The length appearance number tallying unit 254 is a processor that tallies the number of appearances of the length of the longest-match string that has been output from the first longest-match string searching unit 252. The length appearance number tallying unit 254 tallies the number of appearances of each length of the longest-match string based on the length of the longest-match string that has been output from the first longest-match string searching unit 252. Upon completing the tally, the length appearance number tallying unit 254 outputs a tally result to the frequency table generator 255.

The frequency table generator 255 generates the frequency table H11b based on the tally result of the number of appearances of each character that is acquired from the character appearance number tallying unit 253. The frequency table generator 255 generates the frequency table H12b based on the tally result of the number of appearances of each length that is acquired from the length appearance number tallying unit 254. The frequency table generator 255 makes character frequencies correspond to the respective characters based on the total numbers of appearances of the characters. Furthermore, the frequency table generator 255 makes length frequencies correspond to the respective lengths based on the total numbers of appearances of the lengths. The frequency tables H11b and H12b have 256 records. The frequency table generator 255 outputs pieces of information of the frequency table H11b and the frequency table H12b to the Huffman tree generator 256 and the frequency table storage unit 257.

The Huffman tree generator 256 is a processor that generates the Huffman tree 20 based on the frequency table H11b and the frequency table H12b. The Huffman tree generator 256 forms 256 leaf structures to which codes and pieces of preliminary information are made to correspond. The Huffman tree generator 256 forms the 256 leaf structures and assigns codes and frequencies (totals) and code lengths thereof to the respective leaves based on the frequency tables H11b and H12b. The appearance frequency (total) of the code is a value calculated by adding up the appearance frequency (subtotal) of the character and the appearance frequency (subtotal) of the length.

The Huffman tree generator 256 sorts and arranges the leaves in the descending order of the appearance frequencies (total) of the code of the leaves, and generates branches in accordance with the appearance frequencies of the respective codes. For example, the Huffman tree has a root, nodes, branches, and leaves corresponding to the Huffman tree 20 as illustrated in FIG. 11. The structures of the root and the nodes store therein pointers to high-order nodes and pointers to right and left low-order nodes or pieces of data of leaves are stored.

The frequency table storage unit 257 stores the contents of the frequency table H11b and the frequency table H12b in a header portion of the file F2.

The second stage processor 260 is a processor that compresses the file F1. Pieces of processing of the respective units included in the second stage processor 260 are described. The second file reading unit 261 is a processor that reads out data of the content portion in the file F1 onto the storage region A1 corresponding to the encoder. After the processing on the data stored in the storage region A1 is finished, the data in the storage region A1 is made to shift to the storage region A2 to be the reference portion, and the data in the storage region A3 storing therein a compression code is written into F2, the second file reading unit 261 reads out new data from the file F1 and updates the data stored in the storage region A1.

The second longest matching character search unit 262 is a processor that compares the compression data stored in the storage region A2 as the reference portion and the data stored in the storage region A1 and searches for the longest-match string. The processing of searching for the longest-match string is the same as the processing as illustrated in FIG. 3. The second longest matching character search unit 262 outputs the position and the length of the longest-match string to the first encoder 263, the second encoder 264, and the identification bit generator 265.

The first encoder 263 performs processing when the length of the longest-match string is smaller than 3 bytes. When the length of the longest-match string is smaller than 3 bytes, the first encoder 263 compares each character data of 1 byte and the Huffman tree 20 so as to specify a Huffman code of the character data. The first encoder 263 stores the Huffman code in the storage region A3 and outputs it to the file writing unit 267. The Huffman code itself is compression data.

The second encoder 264 performs processing when the length of the longest-match string is equal to or larger than 3 bytes. When the length of the longest-match string is equal to or larger than 3 bytes, the second encoder 264 specifies a position of the longest-match string from a leading character in the storage region A2 and the length of the longest-match string. The second encoder 264 compares the length of the longest-match string and the Huffman tree 20 so as to specify a Huffman code of the length of the longest-match string. The second encoder 264 stores compression data formed by combining the position of the longest-match string, the Huffman code of the length of the longest-match string, and the identification bit in the storage region A3, and outputs the compression data to the file writing unit 267.

The identification bit generator 265 is a processor that outputs the identification bit "0" or the identification bit "1" based on the length of the longest-match string. To be specific, when the length of the longest-match string is smaller than 3 bytes, the identification bit generator 265 outputs the identification bit "0" to the first encoder 263. On the other hand, when the length of the longest-match string is equal to or larger than 3 bytes, the identification bit generator 265 outputs the identification bit "1" to the second encoder 264.

The reference portion updating unit 266 is a processor that stores, in the storage region A2, data stored in the storage region A1 when collation between the storage region A1 and the storage region A2 has been completed.

When the length of the longest-match string is smaller than 3 bytes, the file writing unit 267 writes the compression data formed by combining the identification bit "0" and the Huffman code that is output from the first encoder 263 into the storage region A3. When the length of the longest-match string is equal to or larger than 3 bytes, the file writing unit 267 writes the compression data formed by combining the identification bit "1" and the position and the length of the longest-match string that is output from the second encoder 264 into the storage region A3.

The file writing unit 267 writes the data in the storage region A3 into the compression file F2 after the processing on the storage region A1 is finished.

Procedure of Entire Compression Processing

Figure 14:
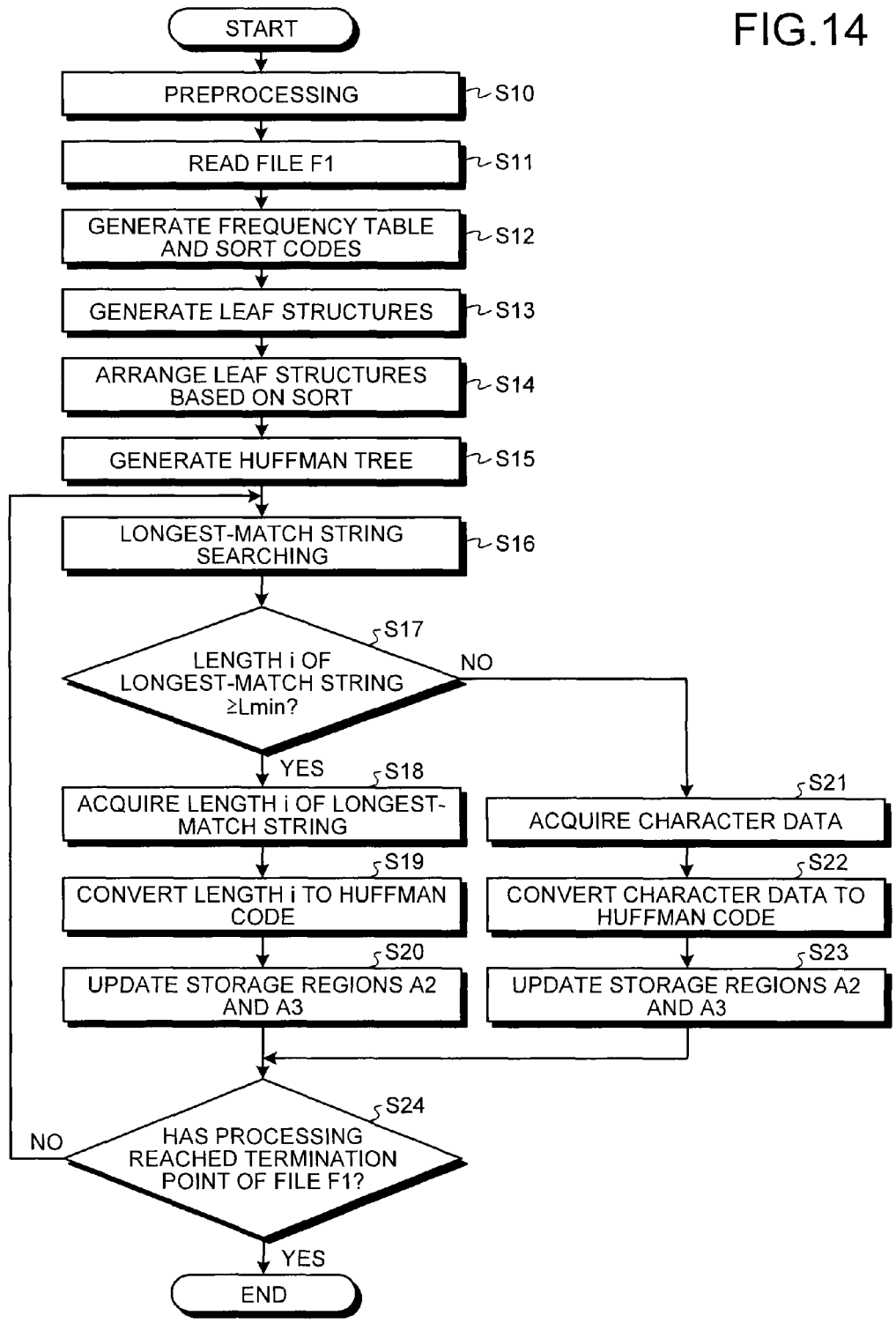
FIG. 14 is a flowchart illustrating an example of the procedure of entire compression processing.

FIG. 14 is a flowchart illustrating the procedure of the entire compression processing. A detailed procedure of step S12 will be described in a sub procedure later. As in an example of FIG. 14, the information processing device 100b generates the Huffman tree 20 in a first half portion at step S10 to step S15 and performs the compression processing using the Huffman tree 20 in a second half portion at step S16 to step S24.

First, processing of generating the Huffman tree 20 in the first half portion is described. The information processing device 100b performs preprocessing (step S10). For example, the information processing device 100b ensures the storage regions A1 to A3 in the first storage region 258.

The information processing device 100b reads the content portion of the file F1 and loads the content portion of the file F1 on the storage region A1 (step S11). The content read into the storage region A1 is stored in the storage region A2 every time the tally processing is completed.

The frequency table generator 255 generates the frequency table H11b and the frequency table H12b based on outputs from the character appearance number tallying unit 253 and the length appearance number tallying unit 254 (step S12). The Huffman tree generator 256 calculates the appearance frequencies (totals) of the respective codes based on the frequency table H11b and the frequency table H12b and sorts the codes in the descending order of the appearance frequencies of the codes (step S12).

The Huffman tree generator 256 generates respective leaf structures (step S13). The Huffman tree generator 256 arranges the leaf structures so as to be aligned in the descending order of the appearance frequencies (total) of the code of the leaf structures based on a sorted result at step S12 (step S14). The Huffman tree generator 256 generates branches and nodes in accordance with the appearance frequencies of the codes so as to generate the Huffman tree (step S15).

Then, the compression processing using the Huffman tree in the second half portion will be described. First, the second longest-match string searching unit 262 compares the storage region A1 and the storage region A2 so as to search for the longest-match string (step S16).

When a length i of the longest-match string is smaller than a predetermined length Lmin (No at step S17), the first encoder 263 acquires a character contained in the storage region A1 (step S21). Subsequently, the first encoder 263 compares the acquired character and the Huffman tree and converts the character into a Huffman code (step S22). The reference portion updating unit 266 copies the character acquired from the storage region A1 to the storage region A2 so as to update the storage region A2, and the file writing unit 267 copies compression data containing the Huffman code of the character to the storage region A3 so as to update the storage region A3 (step S23). Then, the information processing device 100b shifts to processing at step S24.

On the other hand, when the length i of the longest-match string acquired by the second longest-match string searching unit 262 is equal to or larger than the predetermined length Lmin (Yes at step S17), the second encoder 264 acquires the length i of the longest-match string (step S18). The second encoder 264 compares the acquired length i of the longest-match string and the Huffman tree and converts the length i of the longest-match string into a Huffman code (step S19). The reference portion updating unit 266 copies the longest-match string acquired from the storage region A1 to the storage region A2 so as to update the storage region A2 (step S20). The file writing unit 267 copies compression data containing the position and the Huffman code of the length of the longest-match string to the storage region A3 so as to update the storage region A3 (step S20). Then, the information processing device 100b shifts to processing at step S24.

The information processing device 100b finishes the processing when the processing has reached a termination point of the file F1 (Yes at step S24). On the other hand, the information processing device 100b returns to the processing at step S16 when the processing is on the halfway of the file F1 (No at step S24), and compression processing on a subsequent character string is performed.

Procedure of Frequency Calculation Processing

Figure 15:
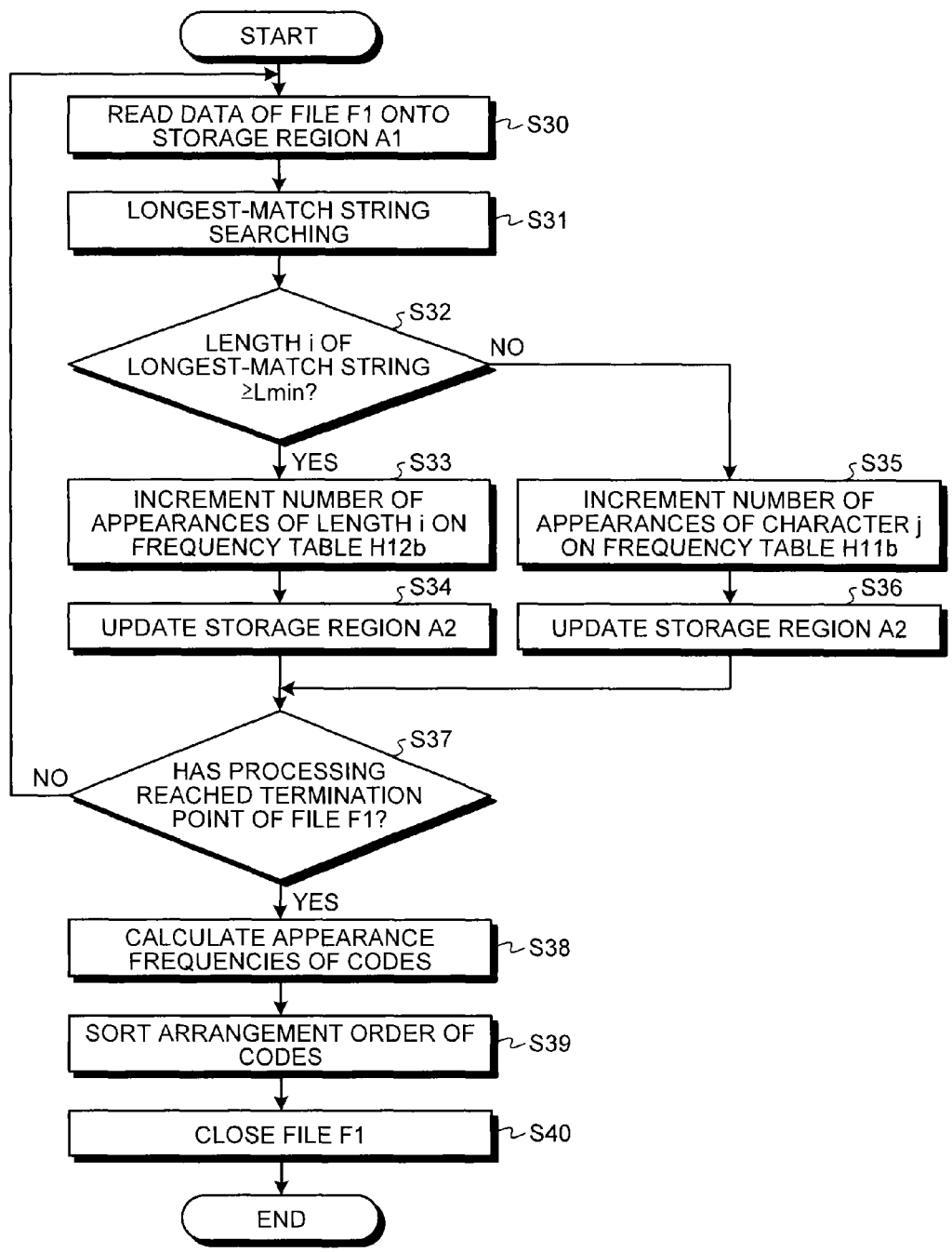
FIG. 15 is a flowchart illustrating an example of the procedure of frequency calculation processing.

FIG. 15 is a flowchart illustrating an example of the procedure of frequency calculation processing. The procedure in FIG. 15 corresponds to step S12 in FIG. 14.

The first file reading unit 251 reads data of the file F1 onto the storage region A1 (step S30). When the first file reading unit 251 reads data of the file F1 onto the storage region A1 next time, it reads, onto the storage region A1, new data subsequent to a portion of the file F1 on which the tally processing has been performed.

The first longest-match string searching unit 252 compares the storage region A1 and the storage region A2 so as to search for the longest-match string (step S31).

When the searched-for length i of the longest-match string is smaller than the predetermined length Lmin (No at (step S32), the frequency table generator 255 increments the number of appearances of a character j contained in the storage region A1 on the frequency table H11b (step S35). The first file reading unit 251 copies the data stored in the storage region A1 to the storage region A2 so as to update the storage region A2 (step S36). Then, the information processing device 100b shifts to processing at step S37.

When the searched-for length i of the searched longest-match string is equal to or larger than the predetermined length Lmin (Yes at step S32), the frequency table generator 255 increments the number of appearances of the length i on the frequency table H12b (step S33). The first file reading unit 251 copies the data stored in the storage region A1 to the storage region A2 so as to update the storage region A2 (step S34). Then, the information processing device 100b shifts to the processing at step S37.

When the processing has reached a termination point of the file F1 (Yes at step S37), the Huffman tree generator 256 adds up the appearance frequencies (subtotals) of the characters and the lengths corresponding to the codes so as to calculate the appearance frequencies (total) of the respective codes (step S38). The Huffman tree generator 256 sorts the arrangement order of the codes in accordance with the calculated appearance frequencies (totals) of the respective codes (step S39). The information processing device 100b closes the file F1 (step S40). On the other hand, when the frequency calculation processing is on the halfway of the file F1 (No at step S37), the information processing device 100b returns to the processing at step S30 and performs the frequency calculation processing.

Processing of Generating Code Frequency Table

FIG. 16 is a diagram illustrating an example of processing of generating a code frequency table. The Huffman tree generator 256 acquires appearance frequencies (subtotals) of characters corresponding to codes from a character frequency table H20b and acquires appearance frequencies (subtotals) of lengths corresponding to the codes from a length frequency table H21b. The Huffman tree generator 256 adds up the appearance frequencies (subtotals) of the characters that correspond to the codes and the appearance frequencies (subtotals) of the lengths that correspond to the codes so as to calculate appearance frequencies (totals) of the codes. The Huffman tree generator 256 assigns code lengths to the codes based on the appearance frequencies (totals) of the codes. The Huffman tree generator 256 stores the frequencies (totals) and the code lengths assigned to the codes in a code frequency table H22b.

For example, the Huffman tree generator 256 adds up an appearance frequency (subtotal) "0.000121" of "NUL" that corresponds to a code "00h" and an appearance frequency (subtotal) "0.0891" of a length "3" that corresponds to a code "00h" so as to calculate an appearance frequency (total) "0.089221" of the code "00h". The Huffman tree generator 256 assigns a code length "3" to the code "00h" based on the appearance frequency (total) "0.089221" of the code. The Huffman tree generator 256 stores the appearance frequency (total) "0.089221" and the code length "3" of the code "00h" in the code frequency table 22b. The Huffman tree generator 256 adds up an appearance frequency (subtotal) "0.000003" of "SOH" that corresponds to a code "01h" and an appearance frequency (subtotal) "0.0532" of a length "4" that corresponds to a code "01h" so as to calculate an appearance frequency (total) "0.053203" of the code "01h". The Huffman tree generator 256 assigns a code length "4" to the code "01h" based on the appearance frequency (total) "0.053203" of the code. The Huffman tree generator 256 stores the appearance frequency (total) "0.053203" and the code length "4" of the code "01h" in the code frequency table 22b.

The Huffman tree generator 256 sorts the code frequency table 22b such that the codes are aligned in the descending order of the appearance frequencies of the codes so as to generate a frequency table H23b. For example, the Huffman tree generator 256 rearranges columns of the frequency table 22b to "65h, 00h, 61h, . . . 01h, 02h, . . . " in the descending order of the appearance frequencies of the codes from the left so as to generate the frequency table H23b. Arrangement of the code frequency table H23b corresponds to arrangement of leaf structures of the Huffman tree.

Figure 17:
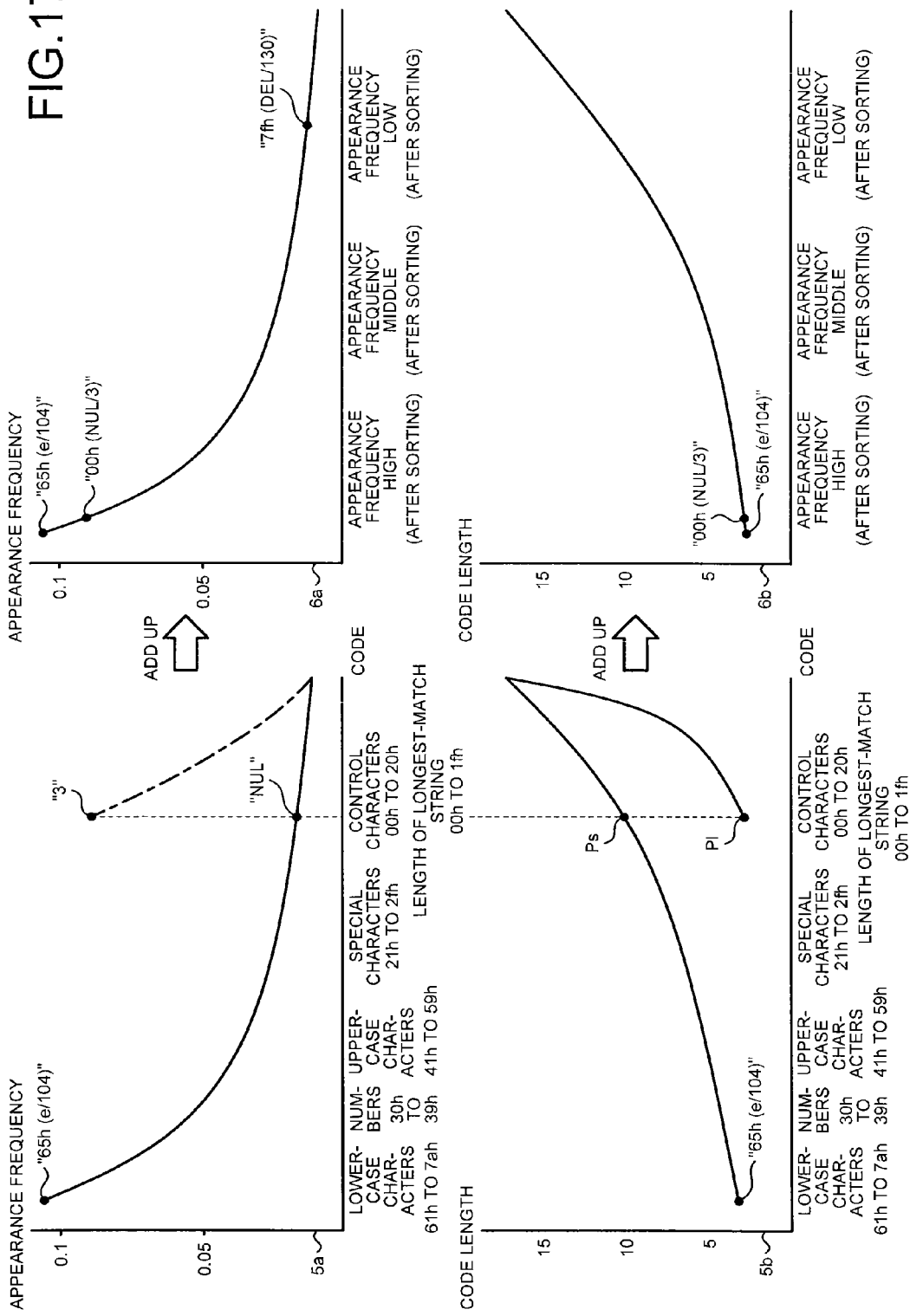
FIG. 17 is a first diagram for explaining code lengths of Huffman codes in the first embodiment.

Code Lengths that are assigned to Characters and Lengths of Longest Matching Character Strings FIG. 17 is a first graph for explaining the code lengths of the Huffman codes in the first embodiment. A frequency distribution graph 5a as illustrated in an example of FIG. 17 indicates an appearance frequency (subtotal) of characters that have been tallied by the information processing device 100b and an appearance frequency (subtotal) of lengths that have been tallied by the information processing device 100b in the first embodiment. The transverse axis of the frequency distribution graph 5a lists characters of lowercase characters, numbers, uppercase characters, special characters, and control characters in the descending order of the appearance frequencies of the characters. The lengths of the longest-match strings are listed in the vicinity of the control characters in the descending order of the appearance frequencies of the lengths. The longitudinal axis of the frequency distribution graph 5a indicates appearance frequencies (subtotals) of the respective characters and the respective lengths.

A code length distribution graph 5b indicates code lengths that are assigned to the respective characters and the respective lengths of the longest-match strings. The transverse axis of the code length distribution graph 5b corresponds to the transverse axis of the frequency distribution graph 5a. The longitudinal axis of the code length distribution graph 5b indicates code lengths that are assigned to the respective characters and the respective lengths.

A frequency distribution graph 6a indicates appearance frequency distribution of codes when the appearance frequencies (subtotals) of the characters and the appearance frequencies (subtotals) of the lengths on the code length distribution graph 5a are added up to calculate appearance frequencies (totals) of the codes and the codes are sorted in the descending order of the appearance frequencies (total) of the codes. The longitudinal axis of the frequency distribution graph 6a indicates the appearance frequencies (totals) of the codes. The transverse axis of the frequency distribution graph 6a lists codes sorted in the descending order of the appearance frequencies of the codes. For example, an appearance frequency (total) of a code "65h" corresponding to a character "e" and a length "104" is "0.110403" as indicated in the frequency distribution graph 6a. An appearance frequency (total) of a code "00h" corresponding to a character "NUL" and a length "3" is "0.089221".

A code length distribution graph 6b indicates code length distribution of codes when the codes are sorted in the descending order of the appearance frequencies of the codes. The transverse axis of the code length distribution graph 6b corresponds to the transverse axis of the frequency distribution graph 6a. The longitudinal axis of the code length distribution graph 6b indicates code lengths that are assigned to the respective codes. For example, a code length "3" is assigned to the code "65h". A code length "12" is assigned to a code "7fh".

As described above, the information processing device 100b in the first embodiment tallies the appearance frequencies (subtotals) of the characters and the lengths and adds up the appearance frequencies (subtotals) of the characters that correspond to the respective codes and the appearance frequencies (subtotals) of the lengths that correspond to the respective codes so as to calculate the appearance frequencies (totals) of the respective codes. Thus, the appearance frequencies (subtotals) of the lengths corresponding to the codes are reflected to the appearance frequencies (totals) of the codes. Accordingly, even when the appearance frequencies (subtotals) of the characters corresponding to the codes are low, small code lengths are assigned to the codes as long as the appearance frequencies (subtotals) of the lengths corresponding to the codes are high. That is to say, the small code lengths are assigned to the codes corresponding to the lengths having high appearance frequencies, thereby improving the compression rate of the file.

Figure 18:
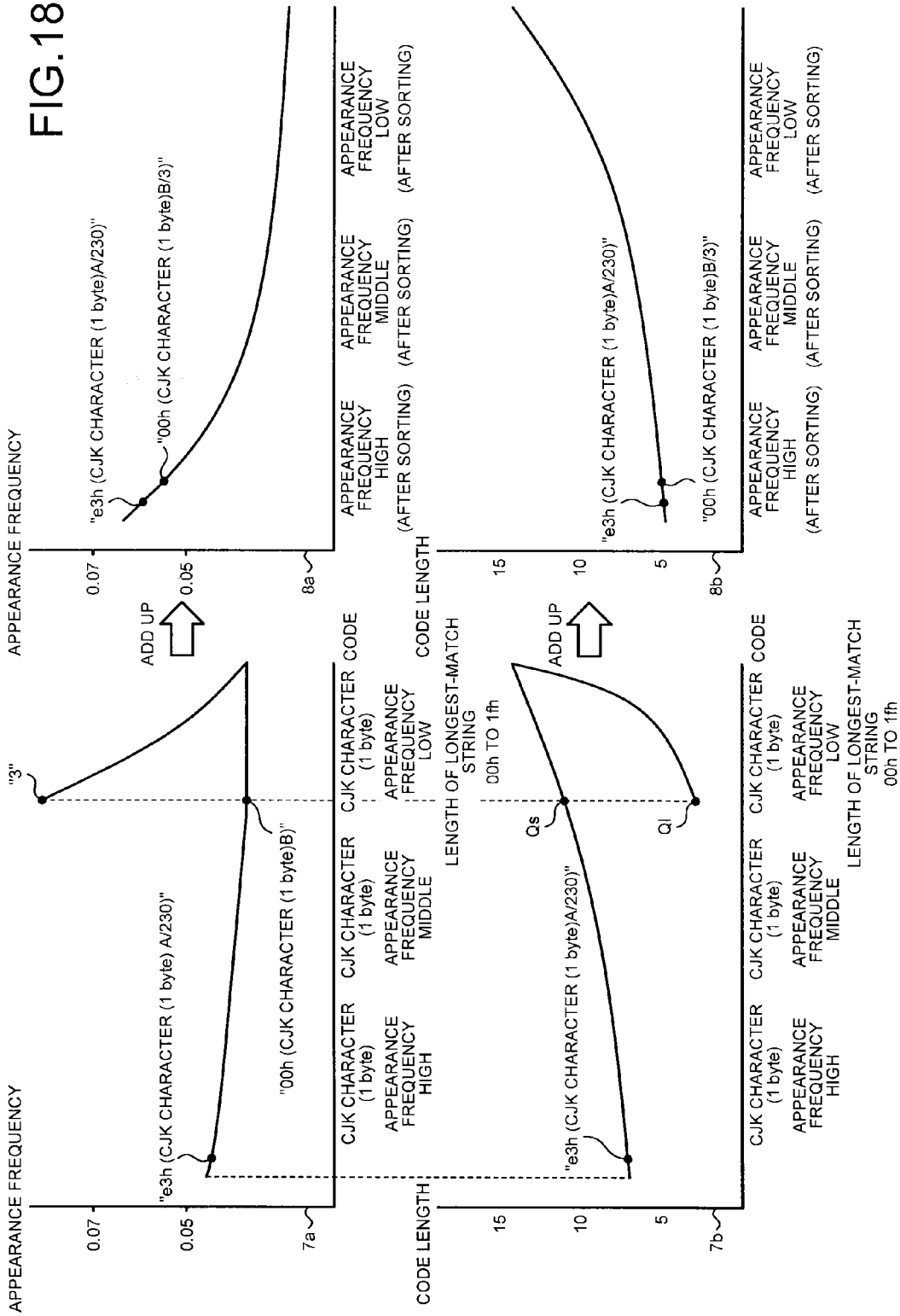
FIG. 18 is a second diagram for explaining the code lengths of the Huffman codes in the first embodiment.

FIG. 18 is a second diagram for explaining the code lengths of the Huffman codes in the first embodiment. A frequency distribution graph 7a as illustrated in an example of FIG. 18 indicates appearance frequencies (subtotals) of CJK characters (1 byte) that have been tallied by the information processing device 100b and appearance frequencies (subtotals) of lengths that have been tallied by the information processing device 100b in the first embodiment. The transverse axis of the frequency distribution graph 7a lists the CJK characters (1 byte) in the descending order of the appearance frequencies of the CJK characters. The lengths of the longest-match strings are listed in the vicinity of the CJK characters (1 byte) having low appearance frequencies in the descending order of the appearance frequencies of the lengths. The longitudinal axis of the frequency distribution graph 7a indicates appearance frequencies (subtotals) of the respective CJK characters (1 byte) and the respective lengths. As indicated in the frequency distribution graph 7a, difference in the appearance frequency is not easily generated among the CJK characters and the appearance frequencies (subtotals) of the respective CJK characters are substantially uniform.

A code length distribution graph 7b indicates code lengths that are assigned to respective codes. The transverse axis of the code length distribution graph 7b corresponds to the transverse axis of the frequency distribution graph 7a. The longitudinal axis of the code length distribution graph 7b indicates code lengths that are assigned to the respective codes.

A frequency distribution graph 8a indicates distribution of appearance frequencies (totals) of the codes when the codes are sorted in the descending order of the appearance frequencies (total) of the codes. The information processing device 100b adds up the appearance frequencies (subtotals) of the CJK characters (1 byte) and the appearance frequencies (subtotals) of the lengths on the code length distribution graph 7a so as to calculate the appearance frequencies (totals) of the respective codes. The longitudinal axis of the frequency distribution graph 8a indicates the appearance frequencies (totals) of the codes. The transverse axis of the frequency distribution graph 8a lists codes sorted in the descending order of the appearance frequencies of the codes. As illustrated in an example of the frequency distribution graph 8a, the appearance frequencies (subtotals) of the lengths of the longest-match strings are reflected to the appearance frequencies (totals) of the codes and different in the appearance frequency between codes having high appearance frequencies and codes having low appearance frequencies is increased.

A code length distribution graph 8b indicates code length distribution when the codes are sorted in the descending order of the appearance frequencies (total) of the codes. The transverse axis of the code length distribution graph 8b corresponds to the transverse axis of the frequency distribution graph 8a. The longitudinal axis of the code length distribution graph 8b indicates code lengths that are assigned to the respective codes. As illustrated in the code length distribution graph 8b, small code lengths are assigned to codes having higher appearance frequencies as a result of the increase in the difference in the appearance frequencies between the codes having high appearance frequencies and the codes having low appearance frequencies.

As described above, the information processing device 100b in the first embodiment adds up the appearance frequencies (subtotals) of the CJK characters (1 byte) that correspond to the respective codes and the appearance frequencies (subtotals) of the lengths that correspond to the respective codes so as to calculate the appearance frequencies (totals) of the codes. When only the appearance frequencies (subtotals) of the CJK characters (1 byte) are reflected to the appearance frequencies (totals) of the codes, little difference in the appearance frequencies is generated among the codes. The difference in the appearance frequencies among the codes is increased by reflecting the appearance frequencies of the lengths of the longest-match strings to the appearance frequencies of the codes. Smaller code lengths are assigned to codes corresponding to lengths of longest-match strings having higher appearance frequencies, thereby improving a compression rate of the file.

Configuration of Decompressing Unit

Figure 19:
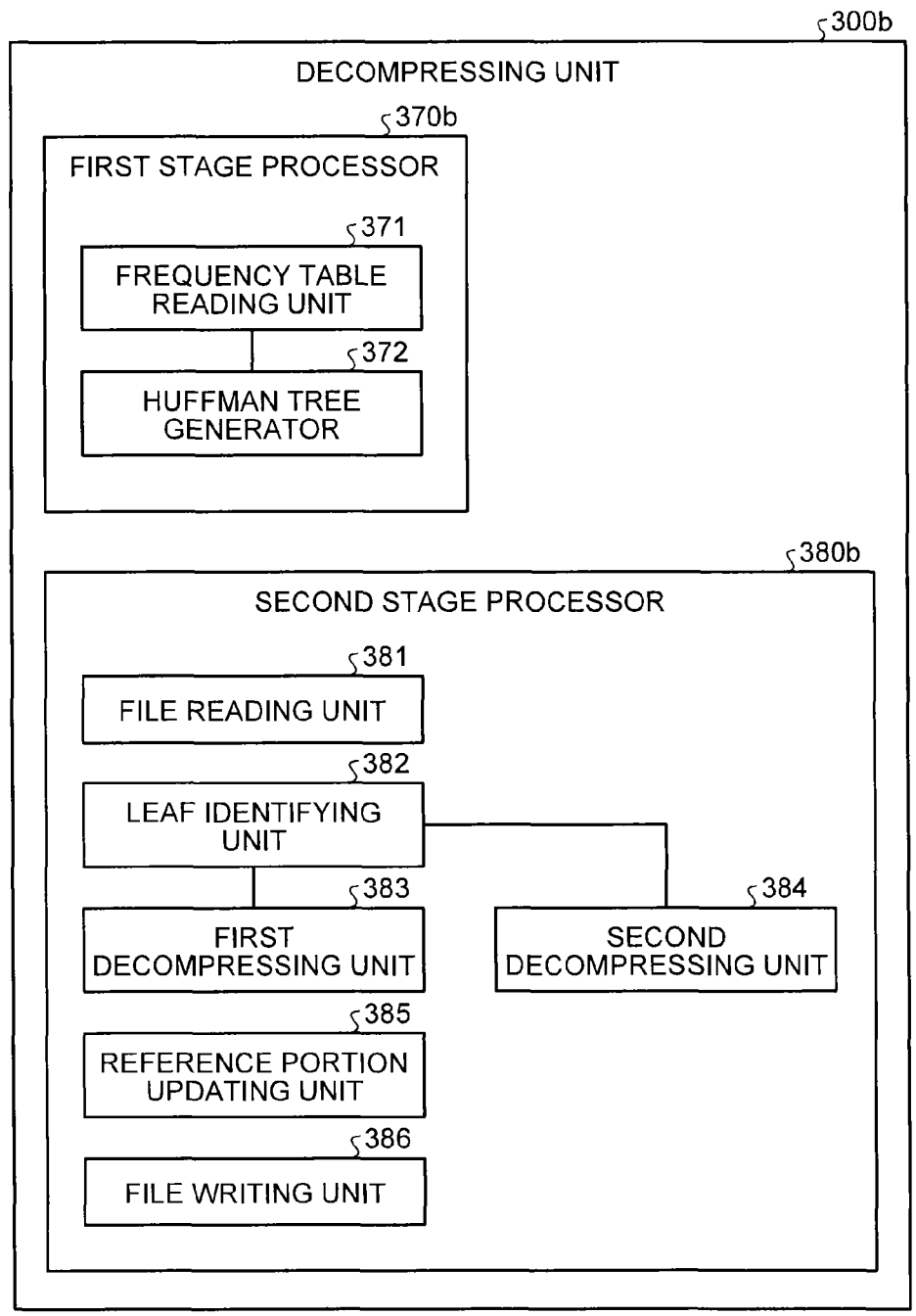
FIG. 19 is a functional block diagram illustrating the configuration of a decompressing unit in the embodiment.

FIG. 19 is a functional block diagram illustrating the configuration of the decompressing unit in the embodiment. As illustrated in FIG. 19, the decompressing unit 300b includes a first stage processor 370b and a second stage processor 380b. The first stage processor 370b includes a frequency table reading unit 371 and a Huffman tree generator 372.

The first stage processor 370b is a processor that generates the Huffman tree 20 based on the pieces of information of the frequency table H11b and the frequency table H12b contained in header information of the compression file F2. Individual processors included in the first stage processor 370b are described.

The frequency table reading unit 371 is a processor that reads out the pieces of information of the frequency table H11b and the frequency table H12b and outputs the pieces of information to the Huffman tree generator 372. For example, the frequency table H11b and the frequency table H12b that are read out by the frequency table reading unit 371 correspond to the frequency table H11b and the frequency table H12b generated by the frequency table generator 255 in FIG. 13, respectively.

The Huffman tree generator 372 is a processor that generates the Huffman tree 20 based on the frequency table H11b and the frequency table H12b. The processing of generating the Huffman tree 20 by the Huffman tree generator 372 is the same as the processing of generating the Huffman tree 20 by the Huffman tree generator 256 in FIG. 13.

The second stage processor 380b is a processor that decompresses the compression file F2. Pieces of processing of the respective units included in the second stage processor 380b are described.

A file reading unit 381 is a processor that reads out compression data in the compression file F2 onto the storage region B1. When processing on the compression data stored in the storage region B1 is finished, the file reading unit 381 reads out new compression data from the compression file F2 and updates the compression data stored in the storage region B1.

A leaf identifying unit 382 is a processor that compares the compression data stored in the storage region B1 and the Huffman tree 20 so as to specify a leaf by following the Huffman tree 20. The leaf identifying unit 382 outputs the specified leaf information to a first decompressing unit 383 and a second decompressing unit 384.

The first decompressing unit 383 performs processing when the identification information is "0". As described in FIG. 4, when the identification information is "0", the first decompressing unit 383 extracts character information from the leaf by following the Huffman tree 20. The first decompressing unit 383 stores, as decompression data, the extracted character information in the storage region B2 and the storage region B3 as the reference portions and outputs the character information to a file writing unit 386.

The second decompressing unit 384 performs processing when the identification information is "1". As described in FIG. 4, when the identification information is "1", the second decompressing unit 384 specifies the length of the longest-match string from the leaf by following the Huffman tree 20. The second decompressing unit 384 specifies the position of the longest-match string based on the compression data and specifies the longest-match string (data) in the storage region B2 based on the specified position and length of the longest-match string. The second decompressing unit 384 stores the longest-match string (data) in the storage regions B2 and B3 as the reference portions, and outputs the longest-match string (data) to a reference portion updating unit 385 and the file writing unit 386.

The reference portion updating unit 385 is a processor that updates the storage region B2 by the decompression data when it has acquired the decompression data from the first decompressing unit 383 or the second decompressing unit 384.

The file writing unit 386 is a processor that stores the decompression data in the storage region B3 and writes the decompression data into the file F3 when it has acquired the decompression data from the first decompressing unit 383 or the second decompressing unit 384.

Procedure of Entire Decompression Processing

Figure 20:
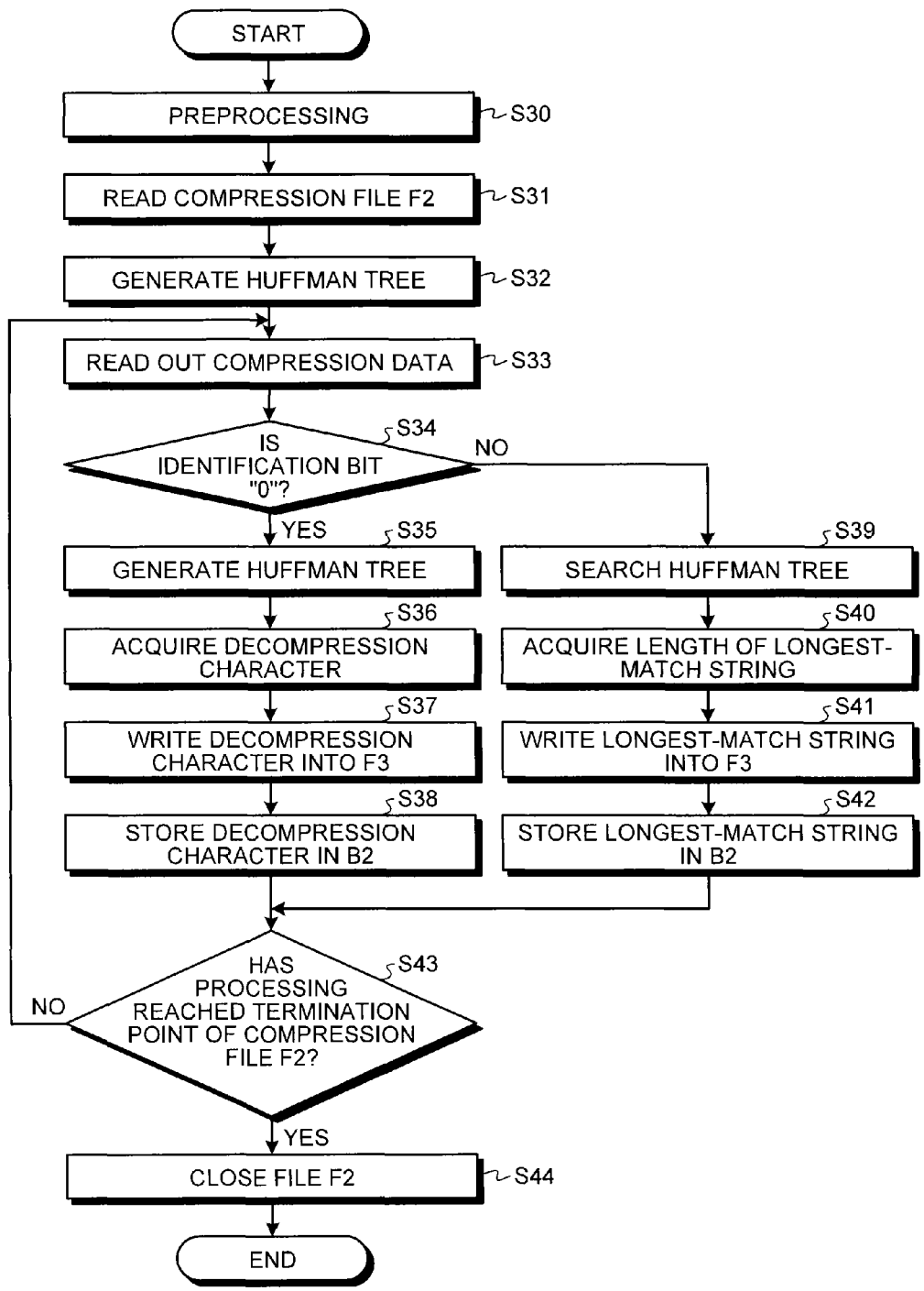
FIG. 20 is a flowchart illustrating an example of the procedure of decompression processing.

FIG. 20 is a flowchart illustrating the procedure of decompression processing. First, the information processing device 100b performs preprocessing (step S30). For example, the information processing device 100b ensures the storage region B1, the storage region B2, and the storage region B3 as operation regions when the decompression processing is performed. The information processing device 100b reads the compression file F2 and loads the compression file F2 on the storage region B1 (step S31). The frequency table reading unit 371 reads out the frequency table H11b and the frequency table H12b contained in the header portion of the compression file F2 and outputs the frequency table H11b and the frequency table H12b to the Huffman tree generator 372. The Huffman tree generator 372 calculates the appearance frequencies of the respective codes and generates the Huffman tree 20 based on the appearance frequencies of the respective codes (step S32). The file reading unit 381 reads out compression data from the file F2 (step S33).

The first decompressing unit 383 performs processing when an identification bit contained in a leaf is "0" (Yes at step S34). The leaf identifying unit 382 compares the compression data stored in the storage region B1 and the Huffman tree 20 so as to search the Huffman tree 20 and specify the leaf (step S35). The first decompressing unit 383 acquires a character based on a code contained in the specified leaf (step S36). The file writing unit 386 writes the decompression character into the file F3 (step S37). The reference portion updating unit 385 stores the character in the storage region B2 as the reference portion (step S38).

The second decompressing unit 384 performs processing when the identification bit contained in the leaf is "1" (No at step S34). The leaf identifying unit 382 compares the compression data stored in the storage region B1 and the Huffman tree 20 so as to search the Huffman tree 20 and specify a leaf (step S39). The second decompressing unit 384 acquires the length of the longest-match string based on a code contained in the specified leaf (step S40). The second decompressing unit 384 acquires the longest-match string from the storage region B2 using the acquired length of the longest-match string and outputs the acquired longest-match string to the file writing unit 386. The file writing unit 386 writes the output longest-match string into the file F3 (step S41). The reference portion updating unit 385 stores the longest-match string in the storage region B2 as the reference portion (step S42).

When the processing has reached a termination point of the compression file F2 (Yes at step S43), the information processing device 100b closes the file F2 (step S44) and finishes the processing. On the other hand, when the processing has not reached the termination point of the compression file F2 (No at step S43), the information processing device 100b returns to the processing at step S33 and performs decompression processing on subsequent compression data.

Effects

The information processing device 100b includes an acquiring unit that acquires an appearance frequency of a code corresponding to character data contained in match data matching with data as a processing target with a largest length among pieces of data extracted from a data sequence as a compression target when the data length of the match data is smaller than a predetermined length and acquires an appearance frequency of a code corresponding to the match data when the data length of the match data is equal to or larger than the predetermined length. The information processing device 100b includes a compressing unit that compresses the data sequence as the compression target using a compression code generated based on the acquired appearance frequency of the code. The acquiring unit is an example of a first stage processor. The compressing unit is an example of a second stage processor. With this configuration, a compression rate of a file can be improved.

The compressing unit 200b generates a tree based on a frequency calculated by adding up an appearance frequency of character data and an appearance frequency of length data that correspond to the same code. The appearance frequency of the character data and the appearance frequency of the length data can therefore be reflected to the appearance frequency of the code.

The compressing unit 200b compresses the data sequence as the compression target using a tree in which character data and length data are assigned to each leaf of the tree. The compressing unit 200b can therefore assign a small compression code to a code having a higher appearance frequency, thereby improving the compression rate of the file.

Other Modes Related to First Embodiment

Hereinafter, some of modifications of the above-mentioned embodiment will be described. Not only the following modifications but also other changes in design in a range without departing from the scope of the invention can be made appropriately.

Although the information processing device 100b compresses the length of the longest-match string when the length of the longest-match string is equal to or larger than 3 bytes in the first embodiment, the byte number of the length for determining whether the length of the longest-match string is compressed may be changed to an arbitrary byte number.

A target of the compression processing is not limited be data in a file and may be a monitoring message that is output from a system. For example, processing of is performed for compressing the monitoring message that is sequentially stored in a buffer by the above-mentioned compression processing and storing the monitoring message as a log file. Furthermore, compression may be performed based on a page in a database or based on a plurality of pages collectively, for example.

Pieces of information including processing procedures, control procedures, specific names, and various pieces of data and parameters can be arbitrarily changed unless otherwise specified.

Hardware Configuration of Information Processing Device

Figure 21:
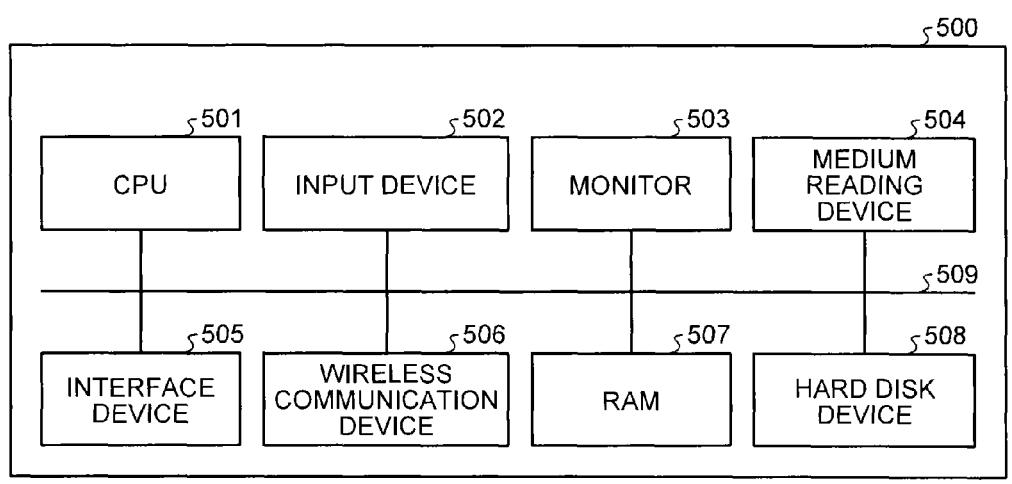
FIG. 21 is a diagram illustrating the hardware configuration of the information processing device in the first embodiment.

FIG. 21 is a diagram illustrating the hardware configuration of the information processing device in the first embodiment. As illustrated in FIG. 21, a computer 500 includes a CPU 501 that executes various pieces of operation processing, an input device 502 that receives data input from a user, and a monitor 503. The computer 500 includes a medium reading device 504 that reads programs and the like from a storage medium, an interface device 505 for connecting the computer to other apparatuses, and a wireless communication device 506 for connecting the computer to other apparatuses wirelessly. The computer 500 includes a RAM 507 that temporarily stores various pieces of information and a hard disk device 508. The individual devices 501 to 508 are connected to a bus 509.

The hard disk device 508 stores therein information processing programs having functions same as those of the respective processors of the first stage processor 250 and the second stage processor 260 as illustrated in FIG. 13. The hard disk device 508 stores therein various pieces of data for executing the information processing programs.

The CPU 501 reads out the respective programs stored in the hard disk device 508, loads them on the RAM 507, and executes them so as to perform various pieces of processing. These programs can cause the computer 500 to function as the first stage processor 250 and the second stage processor 260 as illustrated in FIG. 13.

The above-mentioned information processing programs are not necessarily requested to be stored in the hard disk device 508. For example, the computer 500 may read out and execute programs stored in a storage medium that can be read by the computer 500. The storage medium that can be read by the computer 500 corresponds to a portable recording medium such as a compact disc read only memory (CD-ROM), a digital versatile disc (DVD), and a universal serial bus (USB) memory, a semiconductor memory such as a flash memory, a hard disk drive, and the like. Alternatively, the information processing programs may be stored in an apparatus connected to a public line, the Internet, a local area network (LAN), or the like, and the computer 500 may read out and execute the programs from the apparatus.

Figure 22:
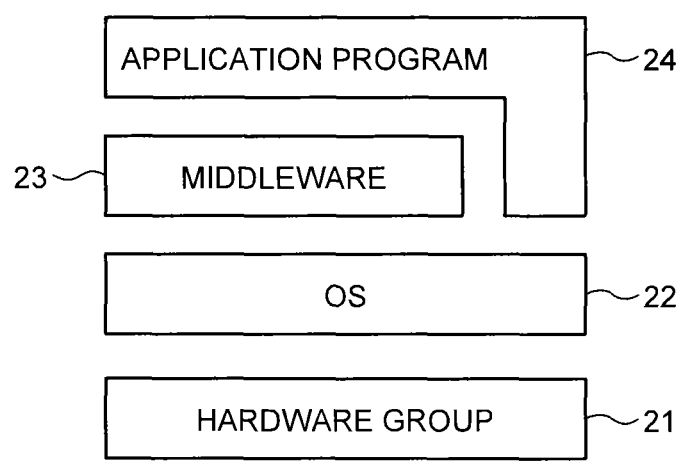
FIG. 22 is a diagram illustrating an example of the configuration of a program operated on a computer.

FIG. 22 is a diagram illustrating an example of the configuration of a program operating on a computer. In the computer 500, an operating system (OS) 22 that controls a hardware group 21 (501 to 509) as illustrated in FIG. 22 operates. The CPU 501 operates with procedures in accordance with the OS 22 and controls and manages the hardware group 21, so that pieces of processing in accordance with an application program 24 and a middleware 23 are executed on the hardware group 21. In the computer 500, the middleware 23 or the application program 24 is read out on the RAM 507 and executed by the CPU 501.

The CPU 501 performs pieces of processing based on at least a part of the middleware 23 or the application program 24 when a compression function is called and functions of a compressing unit 200 are executed (by controlling the hardware group 21 based on the OS 22 for the pieces of processing). The compression function may be contained in the application program 24 or may be a part of the middleware 23 that is executed by being called in accordance with the application program 24.

The compression file F2 that is provided by the compression function of the application program 24 (or the middleware 23) can be also partially decompressed. When a halfway portion of the compression file F2 is decompressed, decompression processing on the compression data to the portion as a decompression target is reduced and load on the CPU 501 is therefore reduced. The compression data as the decompression target is partially loaded on the RAM 507 and a work area is also reduced.

Figure 23:
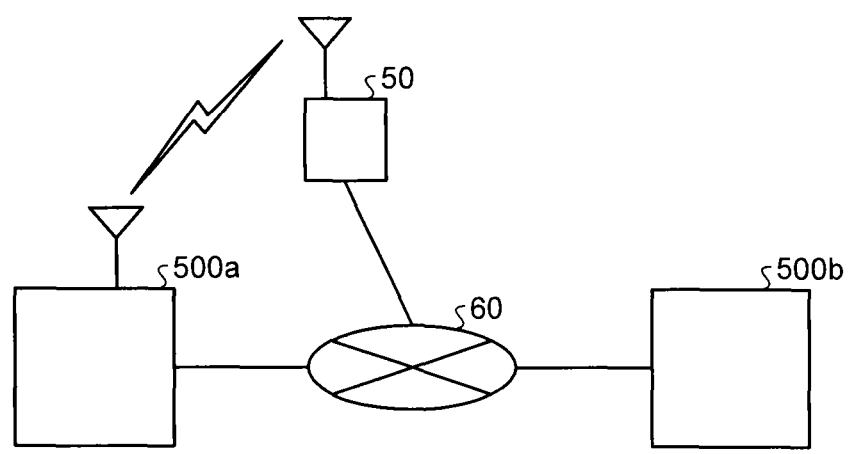
FIG. 23 is a diagram illustrating an example of the configuration of apparatuses in a system according to an embodiment.

FIG. 23 is a diagram illustrating an example of the configuration of apparatuses in a system in the embodiment. A system in FIG. 23 includes a computer 500a, a computer 500b, a base station 50, and a network 60. The computer 500a is connected to the network 60 connected to the computer 500b by at least one of a wireless manner and a wired manner.

The first embodiment of the invention provides an effect of improving a compression rate of a file.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium storing a compression program that causes a computer to execute a process comprising:
   detecting a matched data that matches a processing target data with a longest length among pieces of data, the pieces of data being extracted from a data sequence that is a compression target;
   acquiring an appearance frequency of a code corresponding to character data contained in the matched data when a data length of the matched data is smaller than a predetermined length;
   acquiring an appearance frequency of a code corresponding to the matched data when the data length of the matched data is equal to or larger than the predetermined length; and
   compressing the data sequence using a compression code generated based on the acquired appearance frequency of the code.

2. The non-transitory computer-readable recording medium according to claim 1, wherein the compressing includes generating a tree based on a frequency calculated by adding up an appearance frequency of character data and an appearance frequency of length data that correspond to a same code.

3. The non-transitory computer-readable recording medium according to claim 1, wherein the compressing includes compressing the data sequence as the compression target using a tree in which a code corresponding to character data and length data is assigned to each leaf of a tree.

4. A compression method comprising:
   detecting a matched data that matches a processing target data with a longest length among pieces of data, the pieces of data being extracted from a data sequence that is a compression target;
   acquiring an appearance frequency of a code corresponding to character data contained in the matched data when a data length of the matched data is smaller than a predetermined length;
   acquiring an appearance frequency of a code corresponding to the matched data when the data length of the matched data is equal to or larger than the predetermined length; and
   compressing the data sequence using a compression code generated based on the acquired appearance frequency of the code.

5. A compression device comprising:
   a processor configured to:
      detect a matched data that matches a processing target data with a longest length among pieces of data, the pieces of data being extracted from a data sequence that is a compression target;
      acquire an appearance frequency of a code corresponding to character data contained in the matched data when a data length of the matched data is smaller than a predetermined length;
      acquire an appearance frequency of a code corresponding to the matched data when the data length of the matched data is equal to or larger than the predetermined length; and
      compress the data sequence using a compression code generated based on the acquired appearance frequency of the code.

* * * * *